(12) United States Patent
Tsubuku et al.

(10) Patent No.: US 9,817,040 B2
(45) Date of Patent: Nov. 14, 2017

(54) MEASURING METHOD OF LOW OFF-STATE CURRENT OF TRANSISTOR

(71) Applicant: SEMICONDUCTOR ENERGY LABORATORY CO., LTD., Atsugi-shi, Kanagawa-ken (JP)

(72) Inventors: Masashi Tsubuku, Kanagawa (JP); Kazuma Furutani, Kanagawa (JP); Atsushi Hirose, Kanagawa (JP); Toshihiko Takeuchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 44 days.

(21) Appl. No.: 14/625,984

(22) Filed: Feb. 19, 2015

(65) Prior Publication Data

US 2015/0241510 A1 Aug. 27, 2015

(30) Foreign Application Priority Data

Feb. 21, 2014 (JP) .................................. 2014-031785
Mar. 13, 2014 (JP) .................................. 2014-050310
Mar. 27, 2014 (JP) .................................. 2014-065766

(51) Int. Cl.
*G01R 31/26* (2014.01)
*G01R 19/00* (2006.01)

(52) U.S. Cl.
CPC .............................. *G01R 19/0092* (2013.01)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Jermele M Hollington
*Assistant Examiner* — Douglas X Rodriguez
(74) *Attorney, Agent, or Firm* — Nixon Peabody LLP; Jeffrey L. Costellia

(57) ABSTRACT

A minute current measurement method is provided. In the current measurement method, a first potential is applied to a first terminal of a transistor under test, a second potential is applied to a first terminal of a first transistor, the first transistor is turned on to accumulate a predetermined charge in a node electrically connecting a second terminal of the transistor under test with a second terminal of the first transistor, a third potential of an output terminal of a read circuit electrically connected to the node is measured, the first transistor is turned off, a fourth potential of the output terminal of the read circuit electrically connected to the node is measured, the amount of the charge held by the node is estimated from the amount of change in the potential of the output terminal of the read circuit (e.g., a difference between the third potential and the fourth potential), and a value of current flowing between the first terminal of the transistor (Continued)

under test and the second terminal of the first transistor is calculated from the amount of the charge held by the node.

9 Claims, 25 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0030057 A1* | 2/2005 | Kim .................. G01R 31/2621 324/762.01 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0001504 A1* | 1/2011 | Cho .................. G01R 31/2846 324/756.01 |
| 2011/0148455 A1 | 6/2011 | Kato et al. |
| 2011/0254538 A1 | 10/2011 | Kato et al. |
| 2012/0154337 A1* | 6/2012 | Kurokawa .............. G06F 3/042 345/175 |
| 2014/0204696 A1 | 7/2014 | Kato et al. |
| 2014/0340073 A1 | 11/2014 | Okamoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 | 6/2006 |
| JP | 2011-237418 | 11/2011 |
| WO | WO-2004/114391 | 12/2004 |
| WO | WO2006/051993 | 5/2006 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID

(56) References Cited

OTHER PUBLICATIONS

International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Sekine.Y et al., "Success in Measurement the Lowest Off-State Current of Transistor in the World,", ECS Transactions, 2011, vol. 37, No. 1, pp. 77-88.
Murakami.M et al., "Theoretical Examination on a Significantly Low Off-State Current of a Transistor Using Crystalline In—Ga—Zn-Oxide,", in Proc. AM-FPD'12 Dig., Jul. 2012, pp. 171-174.
Murakami.M et al., "Theoretical Examination on a Significantly Low Off-State Current of a Transistor Using Crystalline In—Ga—Zn-Oxide,", Ext. Abstr. Solid States Devices and Materials, 2012, pp. 320-321.
K. Kato et al., "Evaluation of Off-State Current Characteristics of Transistor Using Oxide Semiconductor Material, Indium-Gallium-Zinc Oxide", Jpn. J. Appl. Phys., 51 (2012), pp. 021201-1-021201-7.
H.Godo et al., "Modeling and Measurement of Ultra-low Leakage Current of IGZO TFTs and New Driving Method of LCDs" IDW '10, 2010, pp. 235-238.

* cited by examiner

FIG. 13A
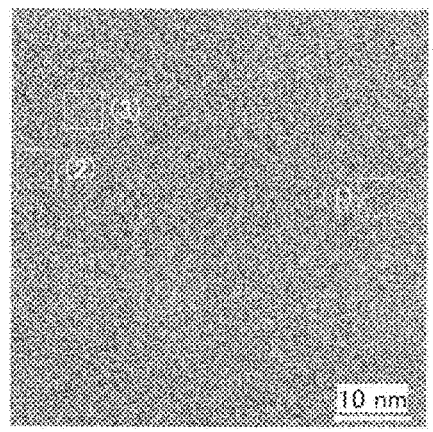
FIG. 13B    FIG. 13C    FIG. 13D
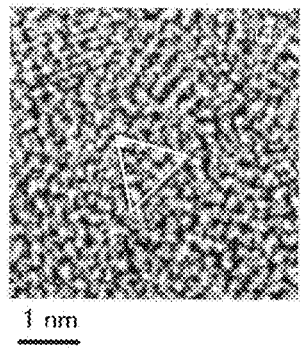 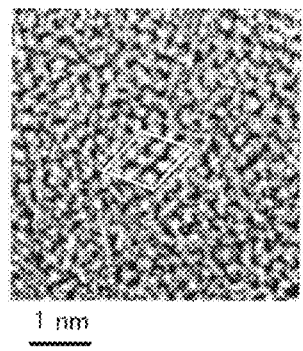 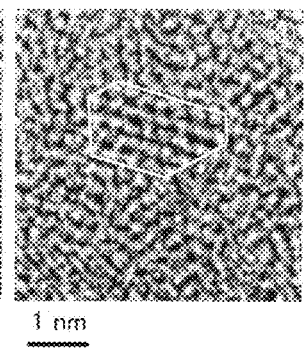

MEASURING METHOD OF LOW OFF-STATE CURRENT OF TRANSISTOR

BACKGROUND OF THE INVENTION

1. Field of the Invention

One embodiment of the present invention relates to a method of measuring a minute current flowing in a semiconductor device.

One embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, specific examples of the technical field of one embodiment of the present invention disclosed in this specification include a semiconductor device, a display device, a light-emitting device, a power storage device, a memory device, a method for driving any of them, and a method for manufacturing any of them.

Note that a semiconductor device in this specification and the like generally means a device that can function by utilizing semiconductor characteristics. A semiconductor element such as a transistor, a semiconductor circuit, an arithmetic device, and a memory device are embodiments of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor, and an oxide semiconductor has been attracting attention as well.

For example, Patent Document 1 discloses a technique in which a transistor is manufactured using an amorphous oxide containing In, Zn, Ga, Sn, and the like as an oxide semiconductor.

In order to manufacture semiconductor devices that need charge retention, such as liquid crystal display devices, it is very important to know the characteristics of transistors in an off state (hereinafter referred to as off-state current), and the like. This is because the parameters of a thin film transistor such as channel length and channel width are determined in accordance with the characteristics of the transistor in an off state.

Patent Document 2 discloses an evaluation method in which current values lower than or equal to $1 \times 10^{-24}$ A can be measured.

PATENT DOCUMENT

[Patent Document 1] Japanese Published Patent Application No. 2006-165529
[Patent Document 2] Japanese Published Patent Application No. 2011-237418

SUMMARY OF THE INVENTION

Parasitic capacitance is generated, for example, between a drain and a gate, between a drain and a source and between a drain and a substrate in measurement of off-state current of a transistor. It is thus required to reduce the influence of the parasitic capacitance as much as possible and obtain more exact value of the off-state current (leakage current).

In view of the above problem, an object of one embodiment of the present invention is to provide a current measurement method that enables a minute current, to provide an examination method of a semiconductor device employing the current measurement method, to provide a semiconductor device employing the current measurement method, to provide a semiconductor device employing the examination method, to provide a characteristics evaluation circuit, or to provide a novel measurement method. Another object of one embodiment of the present invention is to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention includes a transistor under test (a device under test, DUT), a first transistor, a second transistor, and a third transistor. A gate terminal of the first transistor is electrically connected to a first input terminal. One of a source terminal and a drain terminal of the first transistor is electrically connected to a second input terminal. A gate terminal of the transistor under test is electrically connected to a third input terminal. One of a source terminal and a drain terminal of the transistor under test is electrically connected to a fourth input terminal. A gate terminal of the second transistor is electrically connected to the other of the source terminal and the drain terminal of the first transistor and the other of the source terminal and the drain terminal of the transistor under test. One of a source terminal and a drain terminal of the second transistor is electrically connected to one of a source terminal and a drain terminal of the third transistor and an output terminal. A gate terminal of the third transistor is electrically connected to a fifth input terminal. The other of the source terminal and the drain terminal of the third transistor is electrically connected to a sixth input terminal. The other of the source terminal and the drain terminal of the second transistor is electrically connected to a seventh input terminal.

One embodiment of the present invention is a current measurement method in which a first potential is applied to a first terminal of a transistor under test, a second potential is applied to a first terminal of a first transistor, the first transistor is turned on to accumulate a predetermined charge in a node electrically connecting a second terminal of the transistor under test with a second terminal of the first transistor, a third potential of an output terminal of a read circuit electrically connected to the node is measured, the first transistor is turned off, a fourth potential of the output terminal of the read circuit electrically connected to the node is measured, the amount of the charge held by the node is estimated from the amount of change in the potential of the output terminal of the read circuit (e.g., a difference between the third potential and the fourth potential), and a value of current flowing between the first terminal of the transistor under test and the second terminal of the first transistor is calculated from the amount of the charge held by the node.

In the above-described current measurement method, the capacitance between a drain and a substrate of the transistor under test is preferably less than 13.4% of the total capacitance of the node.

In the current measurement method, a channel width of the transistor under test is larger than a channel width of the first transistor.

In the current measurement method, the read circuit includes a second transistor and a third transistor. A first terminal of the second transistor is electrically connected to the node. A first terminal of the third transistor is electrically connected to a second terminal of the second transistor and the output terminal.

In the current measurement method, there preferably is a period in which a potential of a third terminal of the second transistor, a potential of a second terminal of the third transistor, and a potential of a third terminal of the third transistor are equal to one another.

The current measurement method is preferably performed under a constant-temperature environment.

In one embodiment of the present invention, a value of current is calculated from potential change in a predetermined period. The value of a minute current can be measured.

By examining whether or not an electrical element has predefined characteristics using the above current measurement method, defects in a fabricated semiconductor device can be accurately discovered.

A semiconductor device having preferred characteristics can be provided by determining the parameters of an electrical element which is a component of the semiconductor device on the basis of the data on current values obtained by the above current measurement method. According to one embodiment of the present invention, a novel measurement method or a novel semiconductor device can be provided.

Thus, according to one embodiment of the disclosed invention, a variety of technical effects can be obtained.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 13A to 13D are Cs-corrected high-resolution TEM images of a plane of a CAAC-OS.

DETAILED DESCRIPTION OF THE INVENTION

Figure 1:
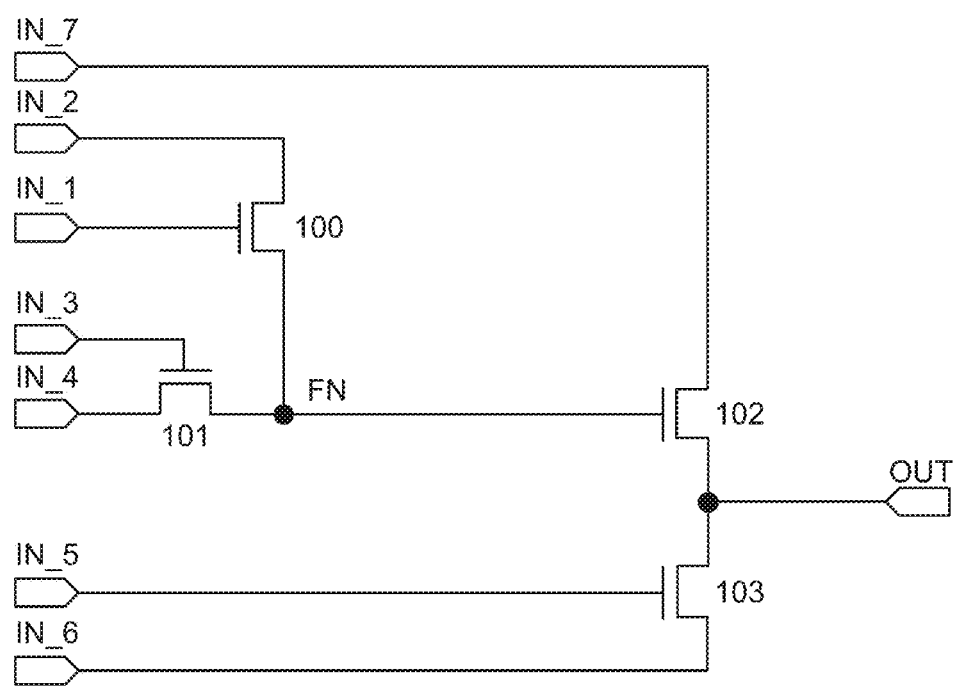
FIG. 1 is a circuit diagram showing an example of a measurement system.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Functions of a source and a drain might be switched when transistors having different polarities are employed or a direction of current flow is changed in circuit operation, for example. Therefore, the terms "source" and "drain" can be replaced with each other in this specification.

In this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. Note that in one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

In this specification, the channel width refers to, for example, the width of a source or a drain in a region where a semiconductor (or a portion where a current flows in a semiconductor when a transistor is on) and a gate electrode overlap with each other or a region where a channel is formed. Note that in one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a width of a portion where a source and a drain face each other in a region where a semiconductor and a gate electrode overlap with each other is referred to as a surrounded channel width (SCW) in some cases. In this specification, in the case where the term "channel width" is simply used, it may denote a surrounded channel width and an apparent channel width. In the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Embodiment 1

In this embodiment, an example of a current measurement method according to one embodiment of the present invention and a measurement system used for the current measurement method will be described with reference to FIG. 1.

<Measurement System>

First, an example of a measurement system used for the current measurement method according to one embodiment of the present invention will be described with reference to FIG. 1. The configuration of the measurement system can be used as that of a circuit for characteristic evaluation. Note that the measurement system described below is just an example.

A measurement system illustrated in FIG. 1 includes a transistor 100, a transistor 101, a transistor 102, and a transistor 103. A gate terminal of the transistor 100 is electrically connected to an input terminal IN_1. One of a source terminal and a drain terminal of the transistor 100 is electrically connected to an input terminal IN_2. A gate terminal of the transistor 101 is electrically connected to an input terminal IN_3. One of a source terminal and a drain terminal of the transistor 101 is electrically connected to an input terminal IN_4. A gate terminal of the transistor 102 is electrically connected to the other of the source terminal and the drain terminal of the transistor 100 and the other of the source terminal and the drain terminal of the transistor 101. One of a source terminal and a drain terminal of the transistor 102 is electrically connected to one of a source terminal and a drain terminal of the transistor 103 and an output terminal OUT. A gate terminal of the transistor 103 is electrically connected to an input terminal IN_5. The other of the source terminal and the drain terminal of the transistor 103 is electrically connected to an input terminal IN_6. The other of the source terminal and the drain terminal of the transistor 102 is electrically connected to an input terminal IN_7. A node connected to the gate terminal of the transistor 102 (i.e., a node connected to the gate terminal of the transistor 102, the other of the source terminal and the drain terminal of the transistor 100, and the other of the source terminal and the drain terminal of the transistor 101) is referred to as a node FN. Note that the transistor 101 is a transistor under test.

In order to measure a minute current, the current needs to be increased to the extent that electric charge transferred by such a small amount of current. In order to increase current per unit channel width to be measured, the channel width of the transistor 101 under test is extremely increased. A change in the amount of charge in the node FN is measured for a long time to estimate an off-state current with the use of the transistor whose channel width is extremely large (1 m in this embodiment).

A circuit for writing potentials to the node FN (also referred to as a write circuit) includes the transistor 100. A circuit for reading the potential of the node FN (also referred to as a read circuit) includes the transistors 102 and 103.

The transistor 100 included in the write circuit is formed at the same time as the transistor 101 under test. Since the channel width of the transistor 100 is smaller than that of the transistor 101, contribution of the channel width to leakage current can be ignored.

The read circuit preferably has a small input capacitance and measures the potential of the node FN with high accuracy. A source follower circuit including the transistors 102 and 103 is used as the read circuit in this embodiment. The transistors 102 and 103 are formed at the same time as the transistor 101 under test.

Because parasitic capacitance is generated in the lines electrically connecting the terminals, the width of the line (terminal) is decreased to reduce the parasitic capacitance. The width of the line (terminal) is preferably 20 nm to 0.5 μm, inclusive. When the width of the line (terminal) is reduced, the capacitance between a drain and a substrate can also be reduced. The drain-substrate capacitance is preferably less than 13.4% of the total capacitance of the node FN, more preferably less than 13.0%. The width of the line (terminal) is set to 0.35 μm in this embodiment. The capacitance of the node FN is set to $5 \times 10^{-10}$ F.

<Current Measurement Method>

Next, an example of a current measurement method using the above-described system of measurement will be described with reference to FIG. 1 and FIG. 2. Note that the current measurement method below is only an example.

First, potential difference is generated between the input terminals IN_1 and IN_2 to turn on the transistor 100, thereby writing the potential of the input terminal IN_2 to the node FN. At that time, the input terminals IN_3 and IN_4 are controlled so that the transistor 101 is off. The input terminals IN_1 and IN_2 are then controlled to turn off the transistor 100, so that the potential of the node FN, i.e., a potential $V_{FN}$, is held. The potentials of the input terminals IN_3 and IN_4 are fixed during a measurement period that follows. In contrast, the potential $V_{FN}$ is not fixed (i.e., the node FN is in a floating state) during the measurement period. As a result, charge flows by the off-state current of the transistor 101, and the potential $V_{FN}$ changes over time. That is, the potential $V_{FN}$ changes in accordance with the change in the amount of charge held in the node FN. The potential of the output terminal OUT, i.e., a potential $V_{OUT}$ changes accordingly.

Next, the amount of change in the potential $V_{FN}$ is obtained from the change in the potential $V_{OUT}$; accordingly, the potential $V_{FN}$ is obtained from the potential $V_{OUT}$. In order to obtain the potential $V_{FN}$ from the potential $V_{OUT}$, the input and output characteristics of an independent read circuit as in FIG. 2, which is a source follower circuit, is independently evaluated in advance.

Figure 2:
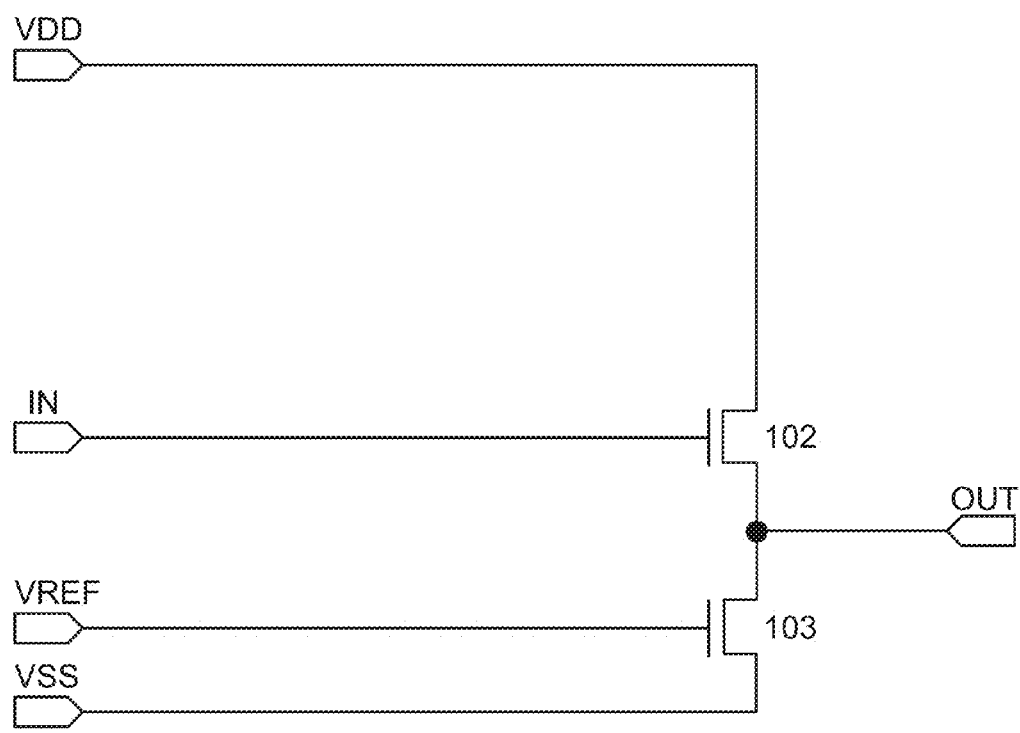
FIG. 2 is a circuit diagram showing an example of a read circuit.

In this embodiment, the input and output characteristics of the read circuit illustrated in FIG. 2 is independently evaluated by varying the potential of an input terminal IN (i.e., a potential $V_{IN}$) and the potential of an input terminal $V_{REF}$ (i.e., a potential $V_{REF}$). Note that the potentials of an input terminal VDD and an input terminal VSS are 3 V and −2 V, respectively. The potential $V_{IN}$ is varied by 0.1 V from −3 V to 4 V. The potential $V_{REF}$ is varied by 0.5 V from −2.5 V to 0 V. Note that the potential $V_{IN}$ corresponds to the potential $V_{FN}$ of the node FN in FIG. 1.

Figure 3:
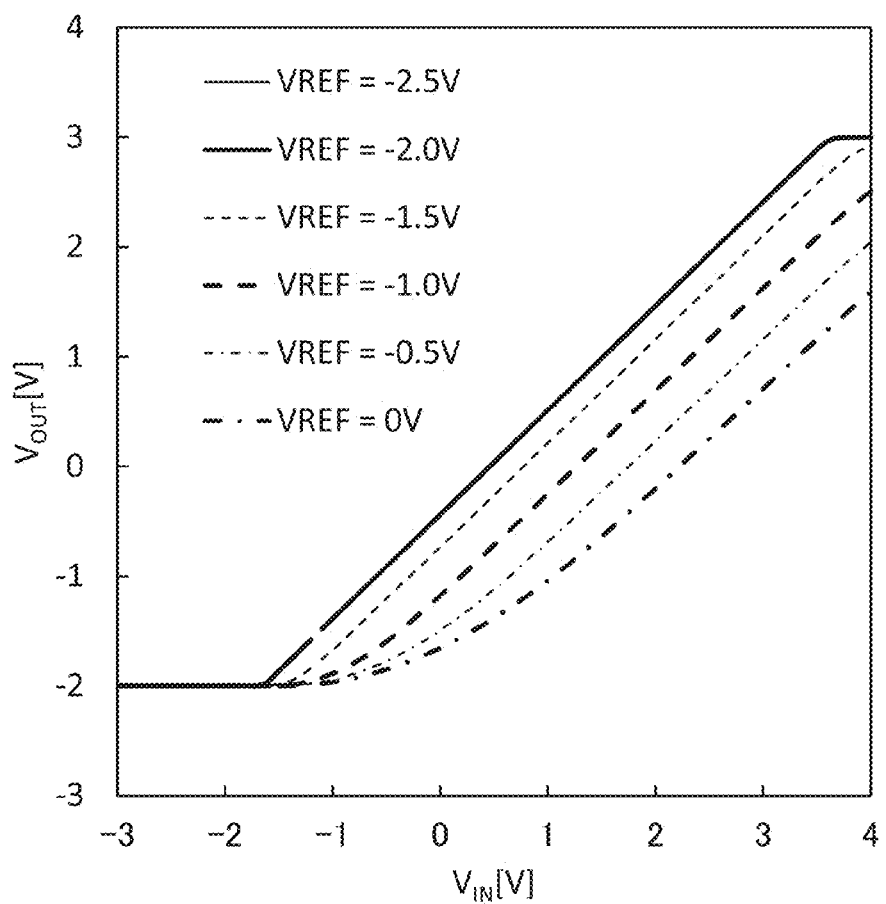
FIG. 3 is a diagram showing input and output characteristics of a source follower circuit.

FIG. 3 shows an example of the input and output characteristics of the source follower circuit.

A linear approximation formula of the potentials $V_{IN}$ and $V_{OUT}$ (see FIG. 4) is calculated from the input and output characteristics of the source follower circuit in FIG. 3. Leakage current is estimated with reference to data at the time when the potential $V_{REF}$ is set to −1.0 V.

Figure 4:
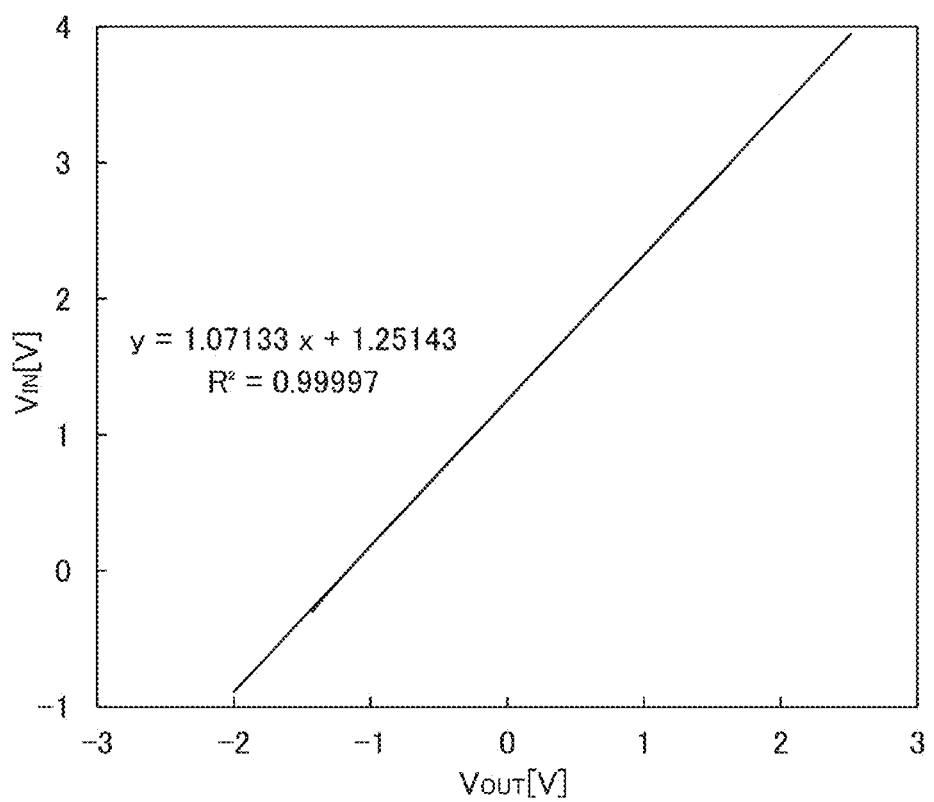
FIG. 4 is a diagram showing an example of relationship between a potential $V_{IN}$ and a potential $V_{OUT}$, which are potentials of an input terminal IN and an output terminal $V_{OUT}$, respectively.

A value of the potential $V_{OUT}$ is assigned to x of the liner appropriation formula in FIG. 4, thereby obtaining y which is the potential $V_{IN}$. The initial and last values of the potential $V_{OUT}$ in the measurement period are assigned thereto, thereby obtaining change in the potential $V_{IN}$.

Leakage current of the transistor 101 is estimated by the formula below.

$$I = \frac{C \Delta V_{FN}}{\Delta t} \quad \text{[Formula 1]}$$

In the formula, I represents leakage current of the transistor 101. C represents the capacitance of the node FN. $\Delta V_{FN}$ represents the amount of change in the potential of the node FN. $\Delta t$ represents the length of the measurement period.

Note that in order to measure the capacitance of the node FN, a configuration of a part around the node FN is fabricated in advance, and the capacitance of the configuration is measured using a semiconductor device analyzer (B1500A manufactured by Agilent Technologies, Inc.).

The leakage current of the transistor 101 is obtained from the capacitance of the node FN, the amount of change in the potential of the node FN, and the measurement period.

Figure 5:
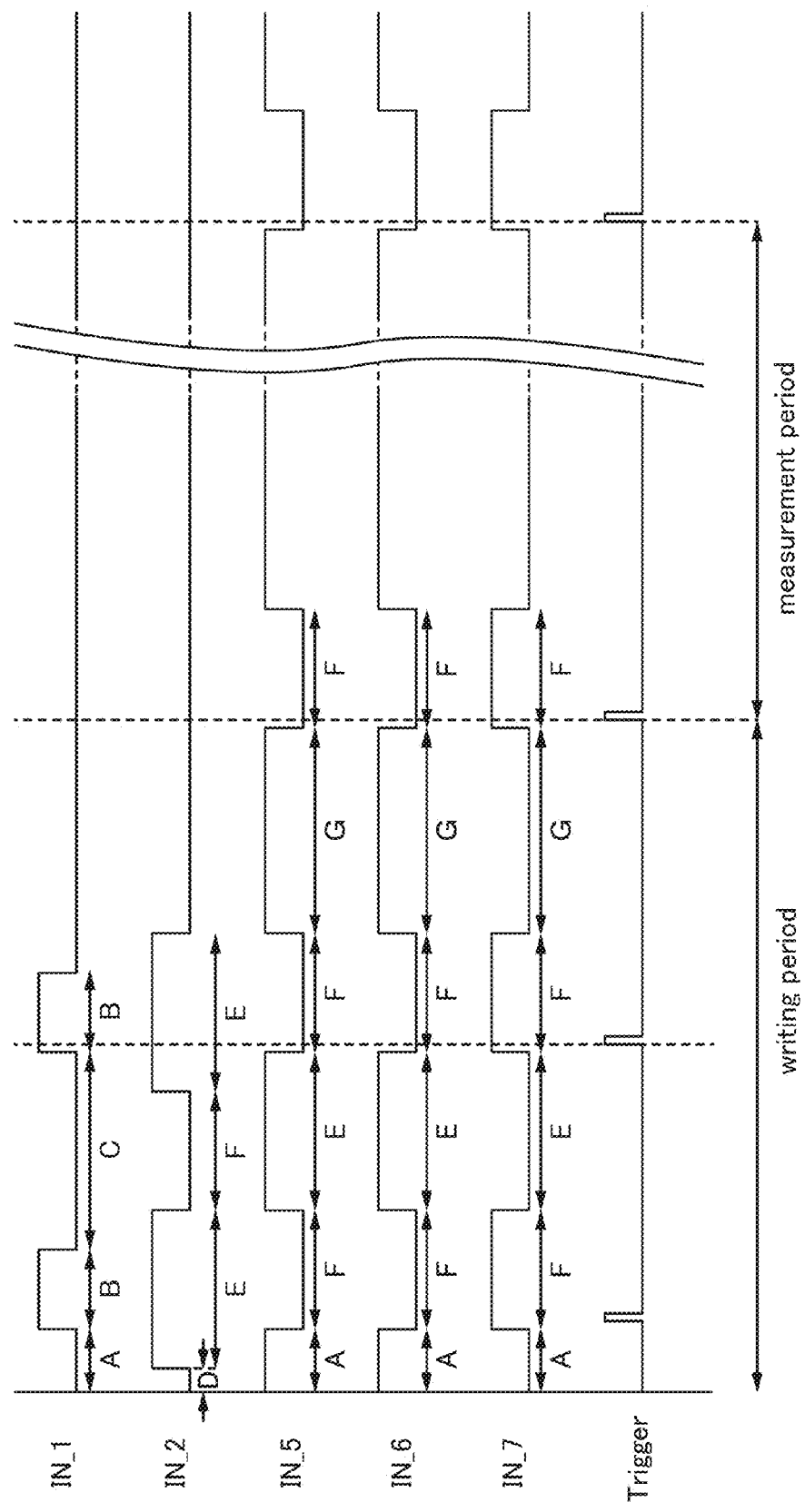
FIG. 5 is a timing chart showing potentials relating to operation of a measurement system.

FIG. 5 shows relationships between potentials of the terminals in the write period and the subsequent measurement period.

First, the measurement system is turned on, a period D passes, and then the potential of the input terminal IN_2 is changed from low to high. In this embodiment, the low potential and the high potential of the input terminal IN_2 are set to 1 V and 2 V, respectively, and the length of the period D is set to 3 seconds.

After the measurement system is turned on and a period A (>the period D) passes, the potential of the input terminal IN_1 is changed from low to high. In this embodiment, the low potential and the high potential of the input terminal IN_1 are set to −3 V and 5 V, respectively, and the length of the period A is set to 8 seconds. When the potential of the input terminal IN_1 becomes high, the transistor 100 is turned on and the potential of the input terminal IN_2 is written to the node FN (i.e., charge is accumulated in the node FN).

At the same time, the potentials of the input terminals IN_5 and IN_6 are changed from high to low, and the potential of the input terminal IN_7 is changed from low to high. In this embodiment, the low potential and the high potential of the input terminal IN_5 are set to −1.5 V and 1.5 V, respectively; the low potential and the high potential of the input terminal IN_6 are set to −2 V and 1.5 V, respectively; and the low potential and the high potential of the input terminal IN_7 are set to 1.5 V and 3 V, respectively. Here, the read circuit including the transistors 102 and 103 fills the linear appropriation formula in FIG. 4, and the potential of the node FN can be estimated from the potential $V_{OUT}$.

The reason why the levels of signals of the input terminals IN_5, IN_6, and IN_7 are changed at the time when the input terminal IN_1 is changed from high to low is to monitor the potential \T$_{out}$ at the time when the potential of the node FN is 2 V (i.e., the potential at the time of writing).

After the potential of the input terminal IN_1 becomes high and a period B passes, the potential of the input terminal IN_1 becomes low and the transistor 100 is turned off. Note that the potential $V_{FN}$ is not fixed (i.e., the node FN is in a floating state) because the potentials of the input terminals IN_3 and IN_4 are fixed. In this embodiment, the potentials of the input terminals IN_3 and IN_4 are set to −3 V and 0 V, respectively, and the length of the period B is set to 10 seconds.

After the potential of the input terminal IN_2 becomes high and a period E passes, the potential of the input terminal IN_2 is changed to low. The period E is set to 20 seconds in this embodiment.

After the potentials of the input terminals IN_5 and IN_6 become low, the potential of the input terminal IN_7 becomes high, and the period F passes, the potentials of the input terminals IN_5 and IN_6 become high and the potential of the input terminal IN_7 becomes low. The period F is set to 15 seconds in this embodiment.

The reason why the potentials of the input terminals IN_5 and IN_6 are changed to high and the potential of the input terminal IN_7 is changed to low is to suppress bias deterioration (the potentials of the input terminals IN_5, IN_6, and IN_7 are all 1.5 V).

Although the total length of the periods D and E is equal to that of the periods A and F, they are not necessarily equal and may be different.

In the period during which the potential of the node FN is 2 V, which is a potential at the time of writing, a signal Trigger for reading the potential $V_{OUT}$ is transmitted to a measurement device, so that the potential $V_{OUT}$ is read by the measurement device. Note that it takes a few seconds for the measurement device to read the potential $V_{OUT}$ after the signal Trigger is transmitted to the measurement device. Thus, reading of the potential $V_{OUT}$ needs to be completed in the period during which the input terminals IN_5 and IN_6 are low and the input terminal IN_7 is high. Furthermore, accurate data might not be obtained even after the signal Trigger is transmitted to the measurement device at the same time when the input terminals IN_5 and IN_6 become low and the input terminal IN_7 becomes high. For this reason, it is preferable to transmit the signal Trigger to the measurement device shortly (e.g., a second) after the input terminals IN_5 and IN_6 become low and the input terminal IN_7 becomes high.

Through the above process, first writing and reading are completed.

Next, after the potential of the input terminal IN_2 becomes low and the period F passes, the potential of the input terminal IN_2 is changed to high.

After the potential of the input terminal IN_1 is changed to low and a period C passes, the potential of the input terminal IN_1 is changed to high. The period C is set to 25 seconds in this embodiment. When the potential of the input terminal IN_1 becomes high, the transistor 100 is turned on to write the potential of the input terminal IN_2 to the node FN.

After the potentials of the input terminals IN_5 and IN_6 become high, the potential of the input terminal IN_7 is low, and a period E passes, the potentials of the input terminals IN_5 and IN_6 are changed to low and the potential of the input terminal IN_7 is changed to high. The read circuit including the transistors 102 and 103 fill the linear appropriation formula in FIG. 4 at that time, and the potential of the node FN can be estimated from the potential $V_{OUT}$. Note that in the period during which the input terminals IN_5 and IN_6 are low and the input terminal IN_7 is high, the signal Trigger for reading the potential $V_{OUT}$ is transmitted to a measurement device, so that the potential $V_{OUT}$ is read by the measurement device.

After the input terminal IN_1 becomes high and the period B passes, the potential of the input terminal IN_1 is changed low, so that the transistor 100 is turned off.

After the potential of the input terminal IN_2 becomes high and the period E passes, the potential of the input terminal IN_2 is changed to low.

After the period F during which the potentials of the input terminals IN_5 and IN_6 are low and the potential of the input terminal IN_7 is high, the potentials of the input terminals IN_5 and IN_6 are changed to high and the potential of the input terminal IN_7 is changed to low.

Through the above process, second writing and reading are completed. The number of times of writing, which is two in this embodiment, is not limited to and may be one or three or more.

After the potentials of the input terminals IN_5 and IN_6 are changed to high, the potential of the input terminal IN_7 is changed to low, and a period G passes, the potentials of the input terminals IN_5 and IN_6 are changed to low and the potential of the input terminal IN_7 is changed to high. The length of the period G is set to 26 seconds in this embodiment.

After the potentials of the input terminals IN_5 and IN_6 become low, the potential of the input terminal IN_7 becomes high, and the period F passes, the potentials of the input terminals IN_5 and IN_6 is changed to high and the potential of the input terminal IN_7 is changed to low.

Although the lengths of periods E and G are different from each other in this embodiment, they may be equal to each other.

Next, the measurement period (data hold period) is described. The measurement period is a period after the signal Trigger is changed from low to high and before the signal Trigger is changed from low to high next. The length of the measurement period is 300 seconds in this embodiment. Note that in the case where the measurement time is an hour, 300-second measurement is performed 12 cycles to read out the potential $V_{OUT}$ every 300 seconds, so that accurate data is obtained.

Figure 6:
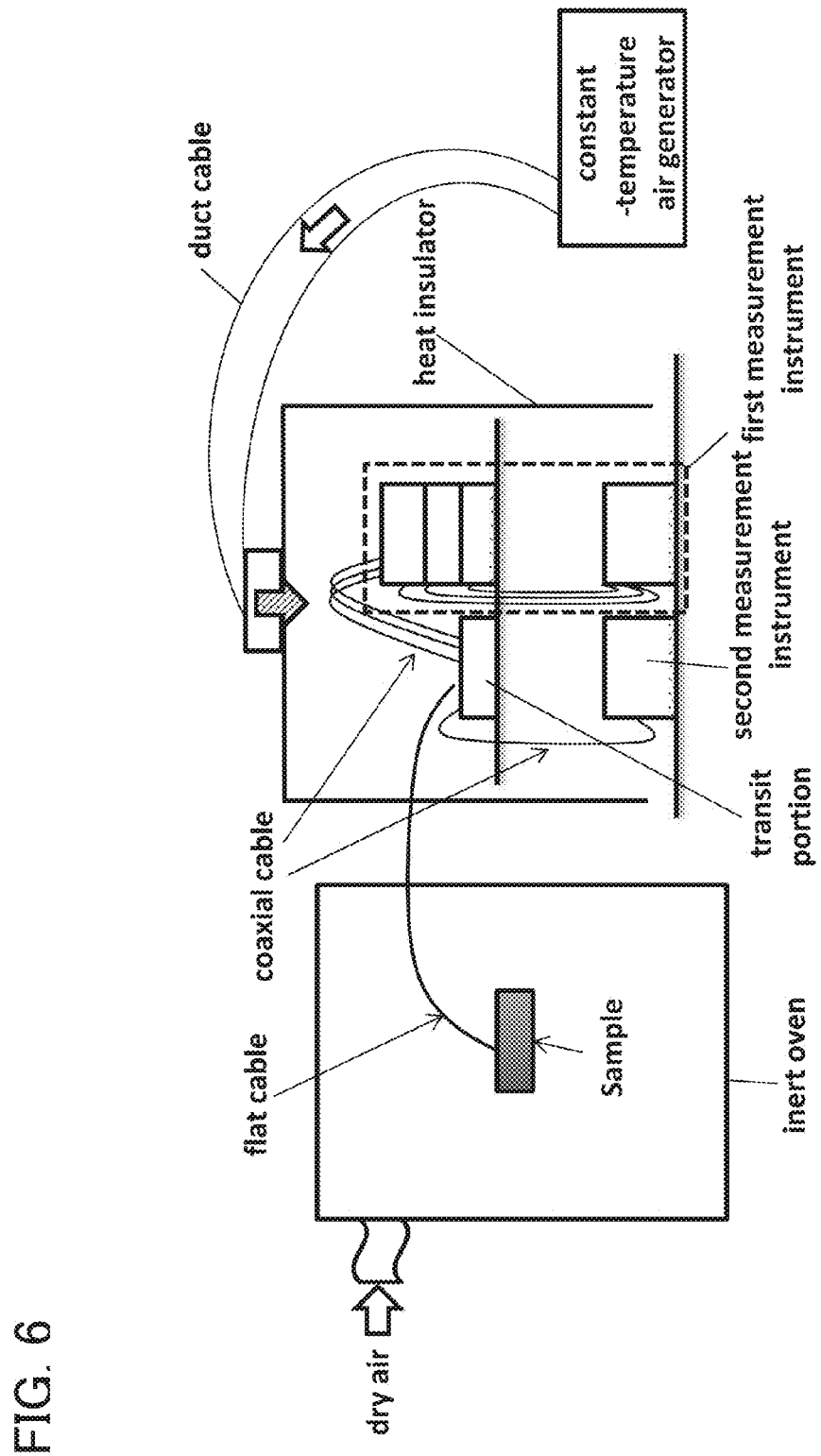
FIG. 6 is a diagram showing a measurement system and the measurement environment in which temperature change is suppressed.

Note that the influence of noise (output voltage variable according to the temperature) due to measurement environment can be reduced by a method as shown in FIG. 6: temperature of a measurement sample including a characteristics evaluation circuit is suppressed so that the sample can be kept at a constant temperature using an inert oven. In addition, peripheral air of the measurement system is also kept constant temperature using a constant-temperature air generator.

Specifically, the measurement sample is set in the inert oven to keep the sample temperature constant. The humidity in the inert oven can be reduced by supplying dry air to the inert oven at that time, which provides a low-humidity measurement environment. The sample is connected to a transit portion with a flat cable. The transit portion is connected to a first measurement instrument and a second measurement instrument with coaxial cables. The first measurement instrument transmits a signal for transmitting data of the sample to the transit portion via the coaxial cable. The data of the sample is supplied to the second measurement instrument via the transit portion. The second measurement instrument reads out the potential $V_{OUT}$. Note that the measurement system is preferably kept at a constant temperature. In order to keep the measurement system at a constant temperature, for example, the measurement system is covered by a heat insulator, a plastic corrugated cardboard, or the like, and constant-temperature air is supplied using the constant-temperature air generator and a duct cable. Note that it is preferable that the measurement system not be entirely covered by the heat insulator, the plastic corrugated cardboard, or the like so that a small amount of constant-temperature air can flow off to the outside.

By the above-described method, a minute current flowing in electrical elements can be measured using a current value estimated from measurement and converted to a current value per micrometer of channel width. For example, a current value of 1 zA (zeptoampere, 1 zA is equal to $10^{-21}$ A) or smaller, or even 1 yA (yoctoampere, 1 yA is equal to $10^{-24}$ A) or smaller can be measured by the method described in this embodiment.

The structures, methods, and the like described in this embodiment can be combined as appropriate with any of the other structures, methods, and the like described in this embodiment or any of the structures, methods, and the like described in the other embodiments.

Embodiment 2

In this embodiment, a semiconductor device (a transistor) using an oxide semiconductor is described with reference to FIGS. 7A to 7C. Although a top-gate transistor is described as an example, the structure of a transistor is not limited to a top-gate structure.

Figure 7A:
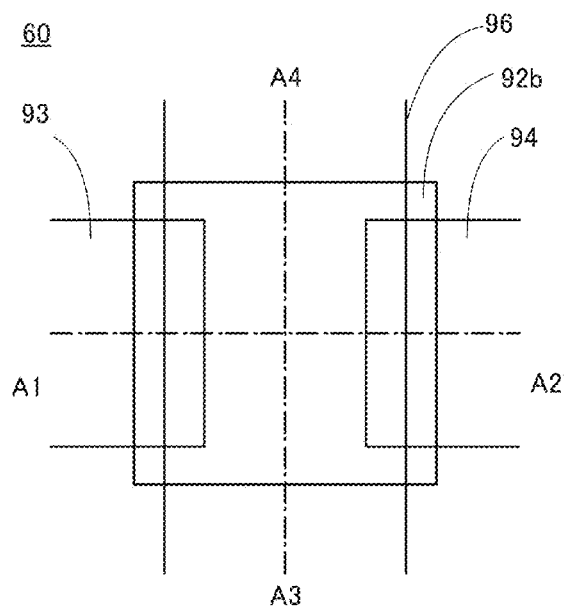
FIGS. 7A to 7C are diagrams illustrating an example of a structure of a transistor.
Figure 7C:
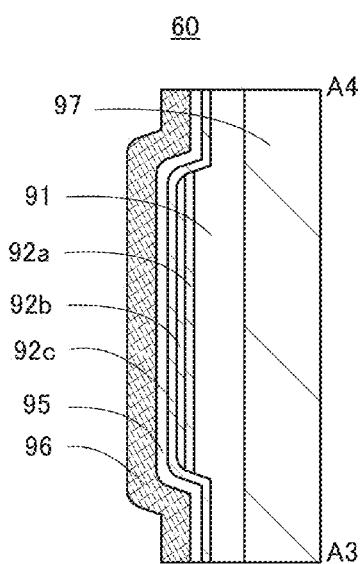
Figure 7B:
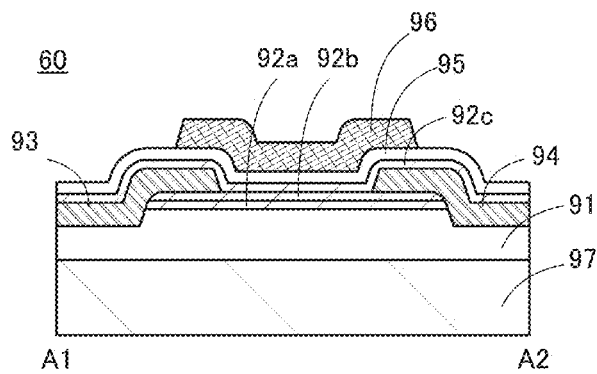

FIGS. 7A to 7C illustrate a structure example of a transistor 60 that includes a channel formation region in an oxide semiconductor film. FIG. 7A is a top view of the transistor 60. Note that insulating films are not illustrated in FIG. 7A in order to clarify the layout of the transistor 60. FIG. 7B is a cross-sectional view along the dashed-dotted line A1-A2 in the top view in FIG. 7A. FIG. 7C is a cross-sectional view along the dashed-dotted line A3-A4 in the top view in FIG. 7A.

As illustrated in FIGS. 7A to 7C, the transistor 60 includes oxide semiconductor films 92a to 92c that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 8A:
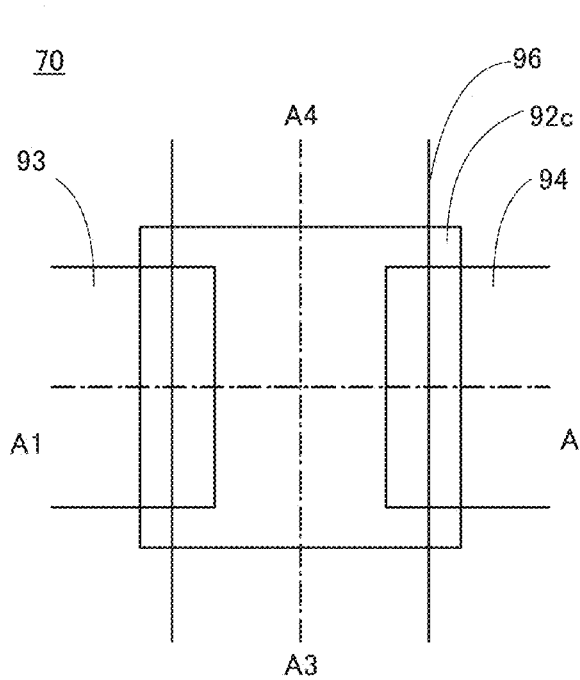
FIGS. 8A to 8C are diagrams illustrating an example of a structure of a transistor.
Figure 8C:
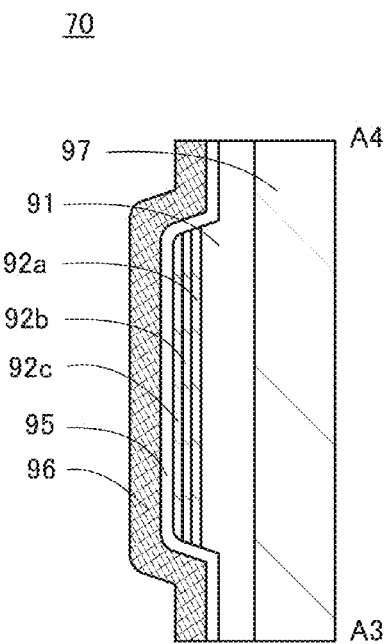
Figure 8B:
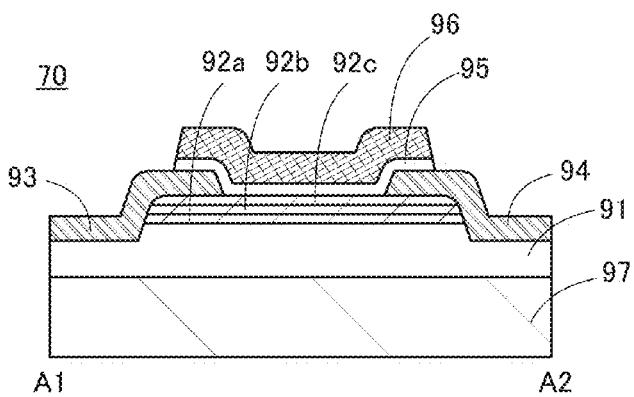

FIGS. 8A to 8C illustrate another specific example of the structure of a transistor. FIG. 8A is a top view of a transistor 70. Note that insulating films are not illustrated in FIG. 8A in order to clarify the layout of the transistor 70. FIG. 8B is a cross-sectional view along the dashed line A1-A2 in the top view in FIG. 8A. FIG. 8C is a cross-sectional view along the dashed line A3-A4 in the top view in FIG. 8A.

As illustrated in FIGS. 8A to 8C, the transistor 70 includes the oxide semiconductor films 92a, 92c, and 92c that are stacked in this order over the insulating film 91 formed over the substrate 97; the conductive film 93 and the conductive film 94 that are electrically connected to the oxide semiconductor film 92b and function as a source electrode and a drain electrode; the oxide semiconductor film 92c over the oxide semiconductor film 92b, the conductive film 93, and the conductive film 94; an insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

Figure 9A:
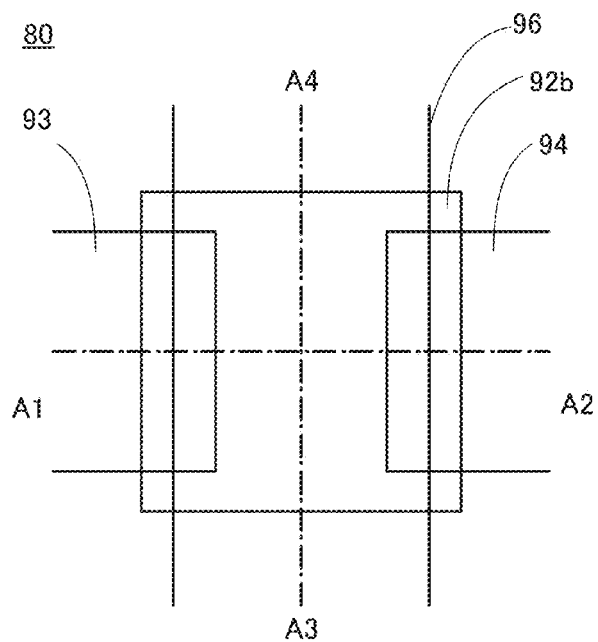
FIGS. 9A to 9C are diagrams illustrating an example of a structure of a transistor.
Figure 9C:
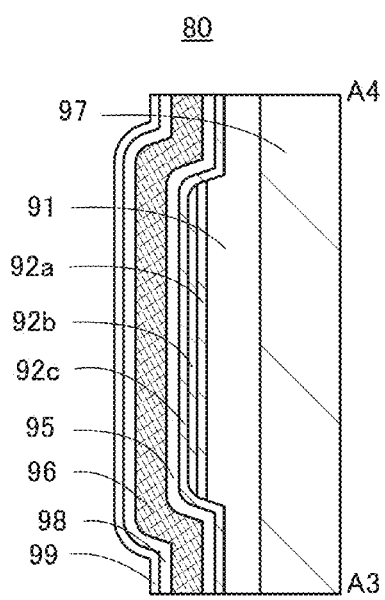
Figure 9B:
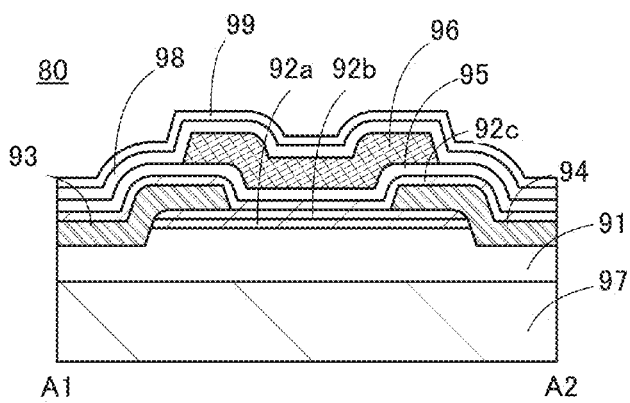

FIGS. 9A to 9C illustrate another specific example of the structure of a transistor. FIG. 9A is a top view of a transistor 80. Note that various insulating films are not illustrated in FIG. 9A in order to clarify the layout of the transistor 80. FIG. 9B is a cross-sectional view along the dashed line A1-A2 in the top view in FIG. 9A. FIG. 9C is a cross-sectional view along the dashed line A3-A4 in the top view in FIG. 9A.

As shown in FIGS. 9A to 9C, a transistor 80 includes insulating films 98 and 99 over the transistor 70 shown in FIGS. 7A to 7C. The insulating film 98 is formed using a material similar to that of the insulating film 95 serving as a gate insulating film. Thus, interface electric charge generated by a bandgap difference between the films can be suppressed.

Figure 10A:
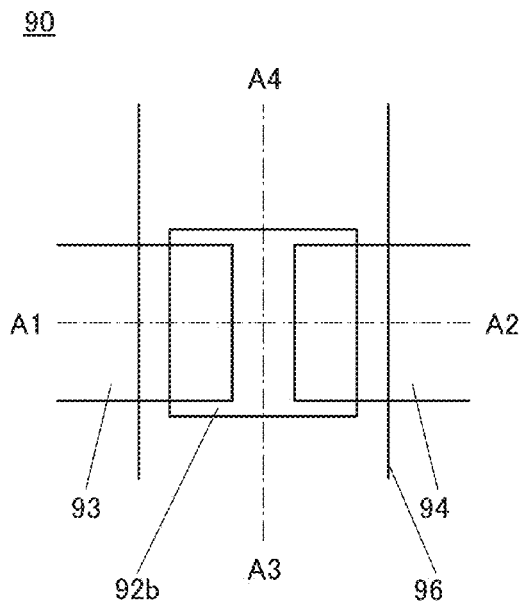
FIGS. 10A to 10C are diagrams illustrating an example of a structure of a transistor.
Figure 10B:
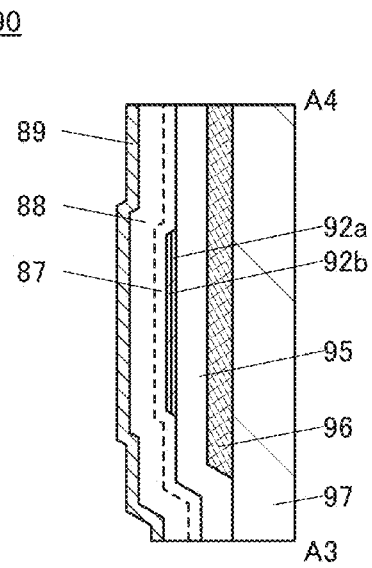
Figure 10C:
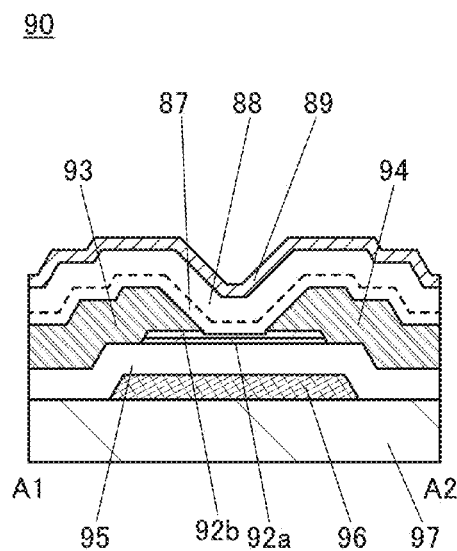

A bottom-gate transistor 90 shown in FIGS. 10A to 10C may be used. FIG. 10A is a top view of the transistor 90. Note that insulating films are not illustrated in FIG. 10A in order to clarify the layout of the transistor 90. FIG. 10B is a cross-sectional view along the dashed line A1-A2 in the top view in FIG. 10A. FIG. 10C is a cross-sectional view along the dashed line A3-A4 in the top view in FIG. 10A.

As shown in FIGS. 10A to 10C, the transistor 90 includes the conductive film 96 serving as a gate electrode over the substrate 97, the insulating film 95 serving as a gate insulating film, the oxide semiconductor film 92b laminated over the oxide semiconductor film 92a over the insulating film 95, the conductive films 93 and 94 electrically connected to the oxide semiconductor film 92b and serving as a source electrode or a drain electrode, and insulating films 87, 88, and 89 over the conductive films 93 and 94.

FIGS. 7A to 7C to FIGS. 9A to 9C each illustrate the structure example of a transistor in which the oxide semiconductor films 92a to 92c are stacked. However, the structure of the oxide semiconductor film included in the transistor is not limited to a stacked-layer structure including a plurality of oxide semiconductor films and may be a single-layer structure.

In the case where the transistor includes the semiconductor film in which the semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor films 92b and 92a, a channel region is also formed in a region close to the interface; thus, the threshold voltage of the transistor varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure allows reducing of variations in the electrical characteristics of the transistor, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the continuity of the energies of the conduction band minima of the oxide semiconductor films is lost, and carriers are trapped or disappear by recombination in the vicinity of the interface. By reducing an impurity existing between the films, a continuous junction (here, in particular, a well structure having a U shape in which energies of the conduction band minima are changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber of the sputtering apparatus is preferably evacuated to a high vacuum (to about $5\times10^{-7}$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1, In:M:Zn=3:1:2, and the like.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like. In the case where the oxide semiconductor film 92c is a gallium oxide film, diffusion of indium into the gate insulating film, which is a cause of leakage current, can be reduced; thus, off-state current of the measurement system can be further reduced.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, so that the transistor can have stable electrical characteristics.

Note that a channel formation region refers to a region of a semiconductor film of the transistor that overlaps with a gate electrode and is located between a source electrode and a drain electrode. Furthermore, a channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target having an atomic ratio of In:Ga:Zn=1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Furthermore, when the oxide semiconductor film 92b is a CAAC-OS film, the oxide semiconductor film 92b is preferably deposited with the use of a polycrystalline In—Ga—Zn oxide target having an atomic ratio of In:Ga:Zn=1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW. When the oxide semiconductor film 92b is a CAAC-OS film, the oxide semiconductor film 92b is preferably deposited with the use of a polycrystalline In—Ga—Zn oxide target containing In, Ga, and Zn in an atomic ratio of 2:1:3.

In the CAAC-OS film deposited with the use of the target, the proportion of a region where a diffraction pattern of the CAAC-OS film is observed in a predetermined area (also referred to as proportion of CAAC) can be high. As a result, the frequency characteristics of a transistor including a channel formation region in the CAAC-OS film can be high.

Note that the oxide semiconductor films 92a to 92c can be formed using a sputtering method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, the measurement method can prove a low off-state current of a transistor having a channel formation region in a highly purified oxide semiconductor film.

In the case where an oxide semiconductor is used as the semiconductor film, at least indium (In) or zinc (Zn) is preferably included in an oxide semiconductor. The oxide semiconductor preferably contains, in addition to In and Zn, gallium (Ga) serving as a stabilizer that reduces variations in electric characteristics of the transistor using the above-described oxide semiconductor film. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

An In—Ga—Zn oxide and an In—Sn—Zn oxide among oxide semiconductors have the following advantages over silicon carbide, gallium nitride, and gallium oxide: transistors with excellent electrical characteristics can be formed by a sputtering method or a wet process and thus can be mass-produced easily. Further, unlike silicon carbide, gallium nitride, or gallium oxide, with the use of the In—Ga—Zn oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio between In, Ga, and Zn. Further, the In—Ga—Zn-based oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reduction in the defect density in a bulk.

A relationship between crystallinity and an oxygen-transmitting property in the case where the oxide semiconductor is an In—Ga—Zn oxide is described below.

An energy barrier due to movement of excess oxygen (oxygen) in a crystal of an In—Ga—Zn oxide is obtained by calculation. In the calculation, plane-wave basis first-principles calculation software Vienna ab-initio simulation package (VASP) based on density functional theory is used. GGA-PBE is used as a functional. Cut-off energy of a plane wave is 400 eV. The effect of an inner shell electron is included by a projector augmented wave (PAW) method.

Figure 11:
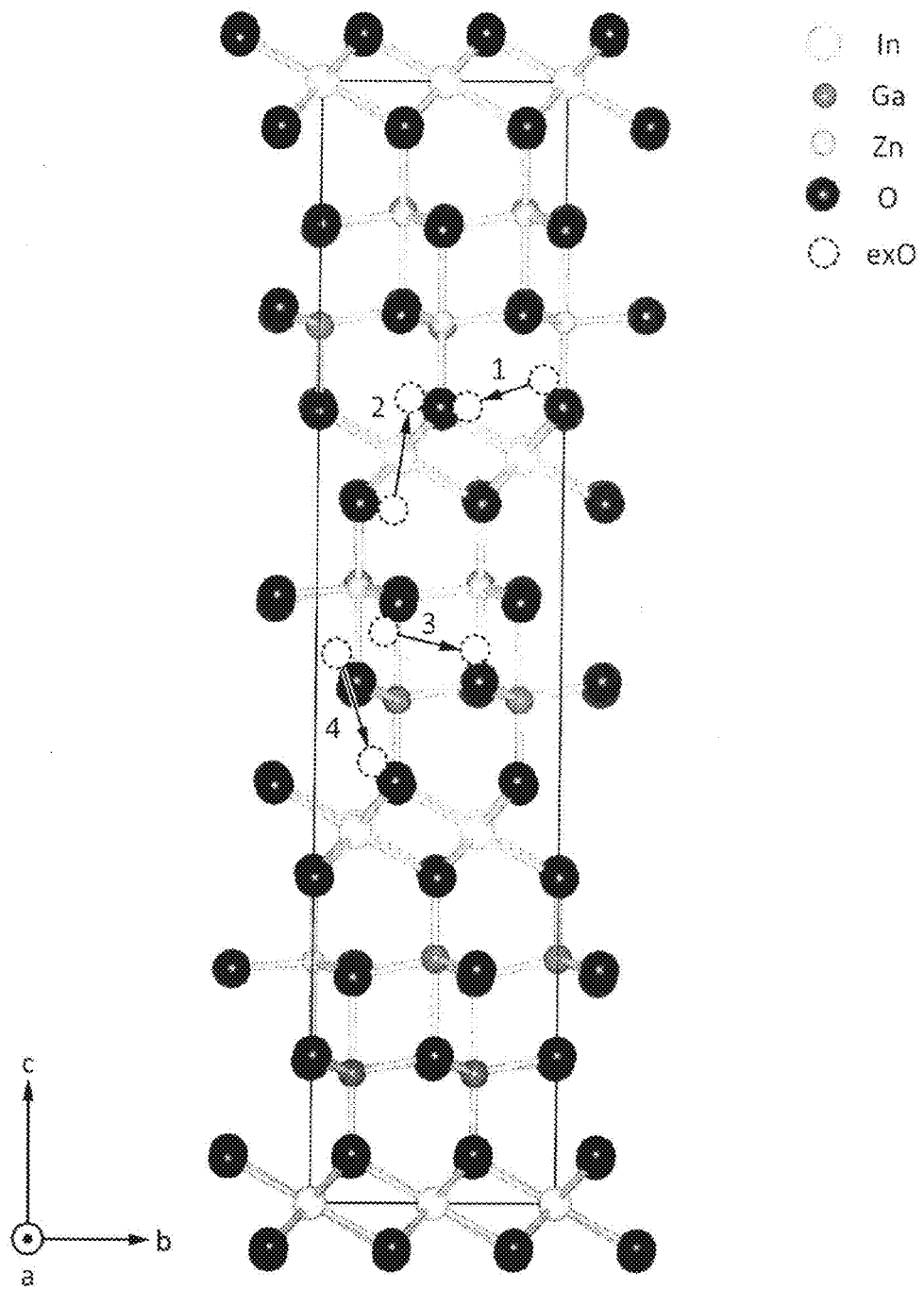
FIG. 11 is a view illustrating a movement path of oxygen in an In—Ga—Zn oxide.

Here, the ease of movement of excess oxygen (oxygen) through movement paths 1 to 4 in a crystal of an In—Ga—Zn oxide illustrated in FIG. 11 is calculated.

The movement path 1 is a path through which excess oxygen (oxygen) bonded to oxygen bonded to three indium atoms and one zinc atom is bonded to adjacent oxygen bonded to three indium atoms and one zinc atom. The movement path 2 is a path through which excess oxygen (oxygen) bonded to oxygen bonded to three indium atoms and one gallium atom crosses a layer containing indium and oxygen and is bonded to adjacent oxygen bonded to three indium atoms and one zinc atom. The movement path 3 is a path through which excess oxygen (oxygen) bonded to oxygen bonded to two gallium atoms and one zinc atom is bonded to adjacent oxygen bonded to two zinc atoms and one gallium atom. The movement path 4 is a path through which excess oxygen (oxygen) bonded to oxygen bonded to two gallium atoms and one zinc atom crosses a layer containing gallium, zinc, and oxygen and is bonded to adjacent oxygen bonded to three indium atoms and one gallium atom.

When the frequency of going over an energy barrier $E_a$ per unit time is referred to as a diffusion frequency R, R can be expressed as the following formula.

$$R = \nu \cdot \exp[-E_a/(k_B T)]$$

Note that $\nu$ represents the number of heat vibrations of diffusion atoms, $k_B$ represents Boltzmann constant, and T represents the absolute temperature. The diffusion frequency R at 350° C. and 450° C. when $10^{13}$ [1/sec] is applied to $\nu$ as Debye frequency is shown in Table 1.

TABLE 1

| | energy barrier | diffusion frequency R [1/sec] | |
|---|---|---|---|
| | [eV] | 350° C. | 450° C. |
| movement path 1 | 0.50 | $9.0 \times 10^8$ | $3.3 \times 10^9$ |
| movement path 2 | 1.97 | $1.2 \times 10^{-3}$ | $1.9 \times 10^{-1}$ |
| movement path 3 | 0.53 | $5.2 \times 10^8$ | $2.0 \times 10^9$ |
| movement path 4 | 0.56 | $3.0 \times 10^8$ | $1.3 \times 10^9$ |

As shown in Table 1, the movement path 2 across the layer containing indium and oxygen has a higher energy barrier than the other movement paths. This indicates that movement of excess oxygen (oxygen) in the c-axis direction is less likely to occur in a crystal of an In—Ga—Zn oxide. In other words, in the case where crystals have c-axis alignment and the c-axes are aligned in a direction substantially perpendicular to a formation surface or a top surface, like CAAC-OS, movement of excess oxygen (oxygen) is less likely to occur in the direction substantially perpendicular to the formation surface or the top surface.

In the transistor, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor illustrated in FIGS. 7A to 7C to FIGS. 9A to 9C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in the oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 22 illustrated in FIGS. 7A to 7C to FIGS. 9A to 9C. Consequently, current that flows between the conductive films 93 and 94 through the end portions of the oxide semiconductor film 92b can be controlled by the potential applied to the conductive film 96. Such a transistor structure is referred to as a surrounded channel (s-channel) structure.

With the s-channel structure, specifically, when a potential at which the transistor is turned off is supplied to the conductive film 96, the amount of off-state current that flows between the conductive films 93 and 94 through the end portions can be reduced. For this reason, in the transistor, even when the distance between the conductive films 93 and 94 at the end portions of the oxide semiconductor film 92b is reduced as a result of reducing the channel length to obtain high on-state current, the transistor can have low off-state current. Consequently, with the short channel length, the transistor can have high on-state current when in an on state and low off-state current when in an off state.

With the s-channel structure, specifically, when a potential at which the transistor is turned on is supplied to the conductive film 96, the amount of current that flows between the conductive films 93 and 94 through the end portions can be increased. The current contributes to an increase in the field-effect mobility and the on-state current of the transistor. When the end portions of the oxide semiconductor film 92b overlap with the conductive film 96, carriers flow in a wide region of the oxide semiconductor film 92b without being limited to a region in the vicinity of the interface of the oxide semiconductor film 92b close to the insulating film 95, which results in an increase in the amount of carrier movement in the transistor. As a result, the on-state current of the transistor is increased, and the field-effect mobility is increased to greater than or equal to 10 cm$^2$/V·s or to greater than or equal to 20 cm$^2$V·s, for example. Note that here, the field-effect mobility is not an approximate value of the mobility as the physical property of the oxide semiconductor film but is an index of current drive capability and the apparent field-effect mobility of a saturation region of the transistor.

<Structure of Oxide Semiconductor Film>

A structure of the oxide semiconductor film is described below. In the following description, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that an angle formed between two straight lines is −30 to 30°. The term "substantially perpendicular" indicates that an angle formed between two straight lines is 80° to 100°, and accordingly includes the case where the angle is greater than or equal to 85° and less than or equal to 95°. In addition, the term "substantially perpendicular" indicates that an angle formed between two straight lines is 60 to 120°. In this specification, the trigonal and rhombohedral crystal systems are included in the hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and thus has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not observed. Thus, in the CAAC-OS, a reduction in electron mobility due to the grain boundary is less likely to occur.

Figure 12A:
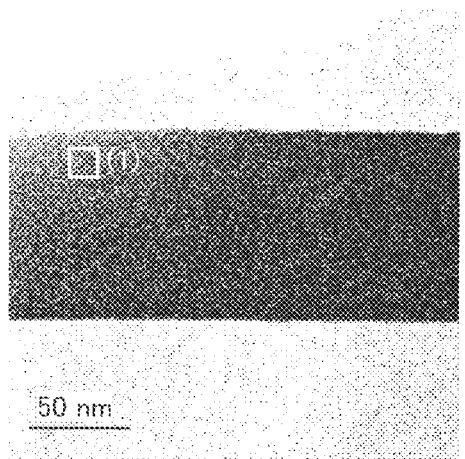
FIGS. 12A to 12C are Cs-corrected high-resolution TEM images of a cross section of a CAAC-OS.

The CAAC-OS observed with a TEM is described below. FIG. 12A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 12B:
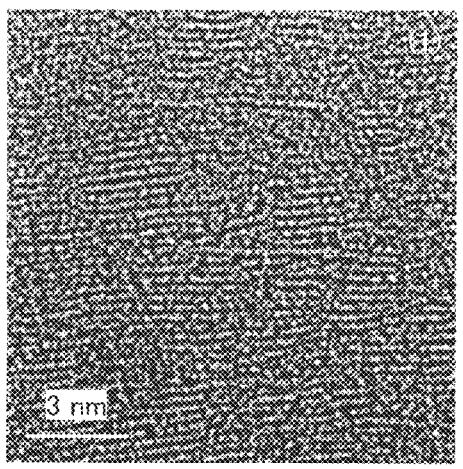

FIG. 12B is an enlarged Cs-corrected high-resolution TEM image of a region (1) in FIG. 12A. FIG. 12B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 12C:
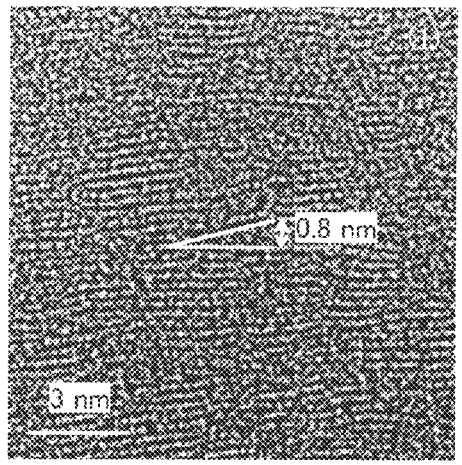

As shown in FIG. 12B, the CAAC-OS has a characteristic atomic arrangement. The characteristic atomic arrangement is denoted by an auxiliary line in FIG. 12C. FIGS. 12B and 12C prove that the size of a pellet is greater than or equal to 1 nm or greater than or equal to 3 nm. The size of a space caused by tilt of the pellets is approximately 0.8 nm. Therefore, the pellet can also be referred to as a nanocrystal (nc). The CAAC-OS can be referred to as an oxide semiconductor including c-axis aligned nanocrystals (CANC).

Figure 12D:
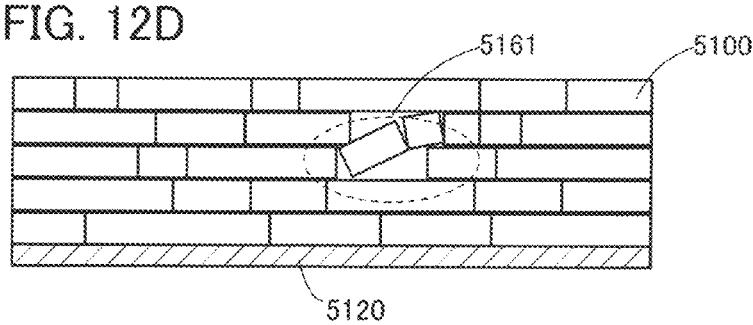
FIG. 12D is a cross-sectional schematic view of the CAAC-OS.

Here, according to the Cs-corrected high-resolution TEM images, the schematic arrangement of pellets 5100 of a CAAC-OS over a substrate 5120 is illustrated by such a structure in which bricks or blocks are stacked (see FIG. 12D). The part in which the pellets are tilted as observed in FIG. 12C corresponds to a region 5161 shown in FIG. 12D.

For example, as shown in FIG. 13A, a Cs-corrected high-resolution TEM image of a plane of the CAAC-OS obtained from a direction substantially perpendicular to the sample surface is observed. FIGS. 13B, 13C, and 13D are enlarged Cs-corrected high-resolution TEM images of regions (1), (2), and (3) in FIG. 13A, respectively. FIGS. 13B, 13C, and 13D indicate that metal atoms are arranged in a triangular, quadrangular, or hexagonal configuration in a pellet. However, there is no regularity of arrangement of metal atoms between different pellets.

Figure 14A:
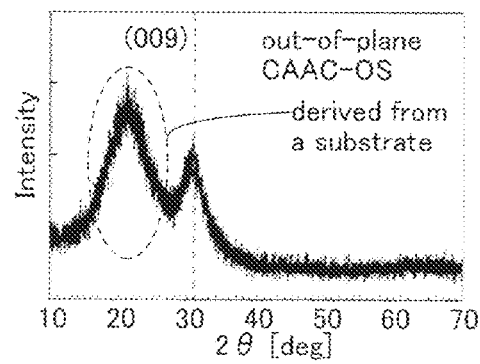
FIGS. 14A to 14C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 14A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

In structural analysis of the CAAC-OS by an out-of-plane method, another peak might appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 14B:
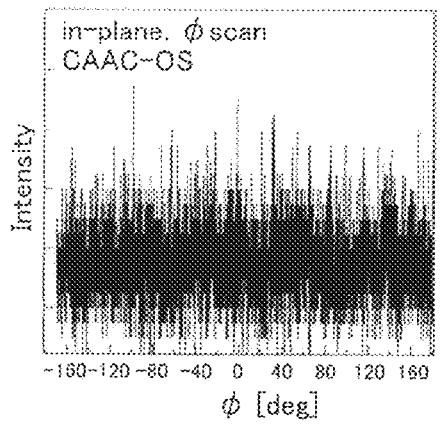
Figure 14C:
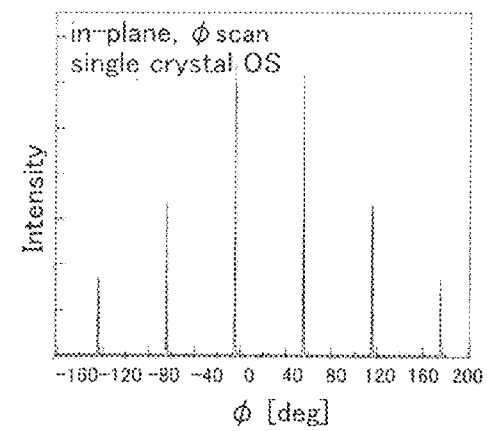

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), a peak is not clearly observed as shown in FIG. 14B. In contrast, in the case of a single crystal oxide semiconductor of InGaZnO$_4$, when φ scan is performed with 2θ fixed at around 56°, six peaks which are derived from crystal planes equivalent to the (110) plane are observed as shown in FIG. 14C. Accordingly, the structural analysis using XRD shows that the directions of a-axes and b-axes are irregularly oriented in the CAAC-OS.

Figure 15A:
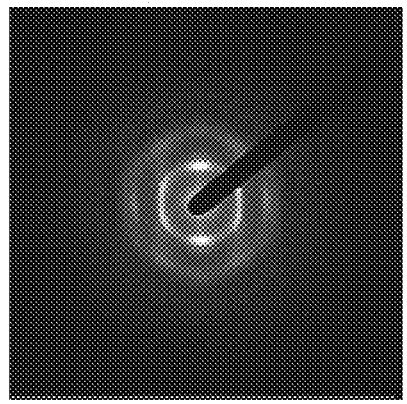
FIGS. 15A and 15B show electron diffraction patterns of a CAAC-OS.
Figure 15B:
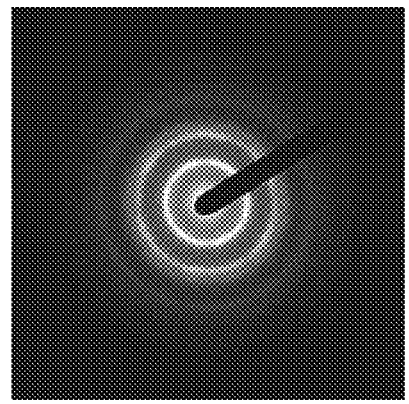

Next, a CAAC-OS analyzed by electron diffraction is described. For example, when an electron beam with a probe diameter of 300 nm is incident on a CAAC-OS including an InGaZnO$_4$ crystal in the direction parallel to the sample surface, a diffraction pattern (also referred to as a selected-area transmission electron diffraction pattern) can be obtained as shown in FIG. 15A. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern as shown in FIG. 15B is observed when an electron beam with a probe diameter of 300 nm is incident on the same sample in a direction perpendicular to the sample surface. Thus, the electron diffraction also indicates that the a-axes and b-axes of the pellets included in the CAAC-OS do not have regular alignment. Note that the first ring in FIG. 15B is considered to be derived from the (010) plane, the (100) plane, and the like of the InGaZnO$_4$ crystal. The second ring in FIG. 15B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (e.g., silicon) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<nc-OS>

Next, an nc-OS is described.

An nc-OS has a region in which a crystal part is observed and a region in which a crystal part is not observed clearly in a high-resolution TEM image. In most cases, a crystal part in the nc-OS is greater than or equal to 1 nm and less than or equal to 100 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, a grain boundary cannot be found clearly in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor depending on an analysis method. For example, when the nc-OS is subjected to structural analysis using an X-ray having a diameter larger than the diameter of a pellet, a peak that shows a crystal plane does not appear. Furthermore, a halo pattern is shown in an electron diffraction pattern of the nc-OS obtained by using an electron beam having a probe diameter larger than the diameter of a pellet (e.g., larger than or equal to 50 nm). Meanwhile, spots are shown in a nanobeam electron diffraction pattern of the nc-OS obtained by using an electron beam having a probe diameter close to or smaller than the diameter of a pellet. Furthermore, in a nanobeam electron diffraction pattern of the nc-OS, regions with high luminance in a circular (ring) pattern are observed in some cases. Moreover, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<A-Like OS>

An a-like OS is an oxide semiconductor having a structure between the nc-OS and the amorphous oxide semiconductor.

In a high-resolution TEM image of the a-like OS, a void may be seen. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. Thus, the spacing between these adjacent layers is substantially equivalent to the lattice spacing (also referred to as d value) on the (009) plane, and is 0.29 nm according to crystal structure analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 16:
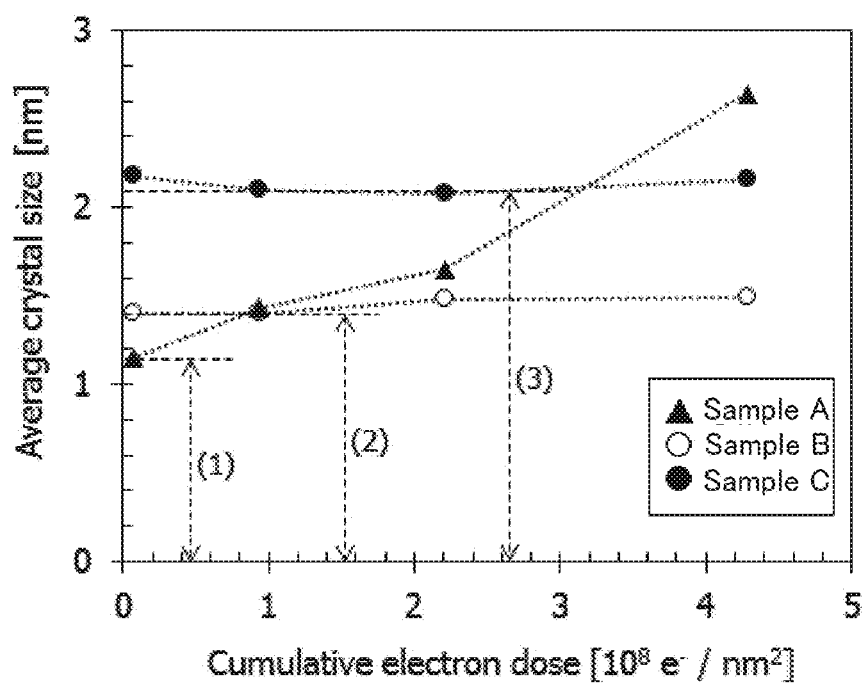
FIG. 16 shows a change in a crystal part of an In—Ga—Zn oxide induced by electron irradiation.

FIG. 16 shows a change in the average size of crystal parts (at 22 points to 45 points) in each sample. Note that the crystal part size corresponds to the length of a lattice fringe. FIG. 16 indicates that the crystal part size in the a-like OS increases with an increase in the cumulative electron dose. Specifically, as shown by (1) in FIG. 16, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 16, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. Note that an oxide semiconductor may be a stacked film including two or more of an amorphous oxide semiconductor, an a-like OS, an nc-OS, and a CAAC-OS.

The structure and method described in this embodiment can be implemented by being combined as appropriate with any of the other structures and methods described in the other embodiments.

Embodiment 3

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other than the above, as electronic devices which can be equipped with the semiconductor device according to one embodiment of the present invention, mobile phones, portable game machines, portable information terminals, e-book readers, video cameras such as digital still cameras, goggle-type displays (head mounted displays), navigation systems, audio reproducing devices (e.g., car audio systems and digital audio players), copiers, facsimiles, printers, multifunction printers, automated teller machines (ATM), vending machines, medical devices, and the like can be given. FIGS. 17A to 17F are specific examples of these electronic devices.

Figure 17A:
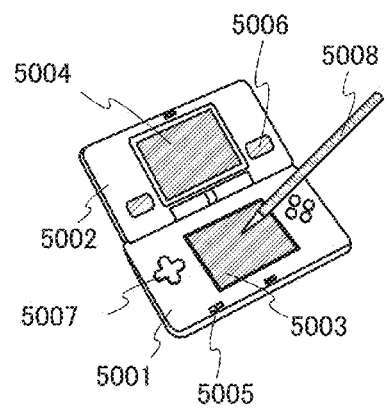
FIGS. 17A to 17F each illustrate an electronic device.

FIG. 17A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine illustrated in FIG. 17A has the two display portions 5003 and 5004, the number of display portions included in the portable game machine is not limited to this.

Figure 17B:
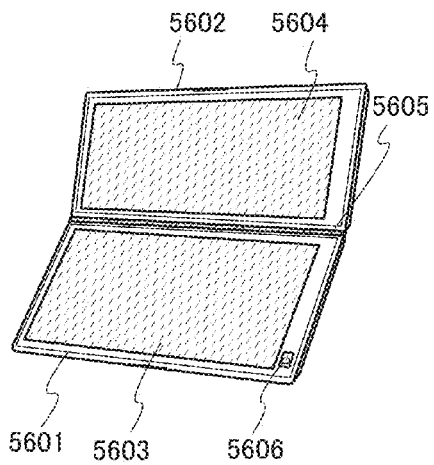

FIG. 17B illustrates a personal digital assistant, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 17C:
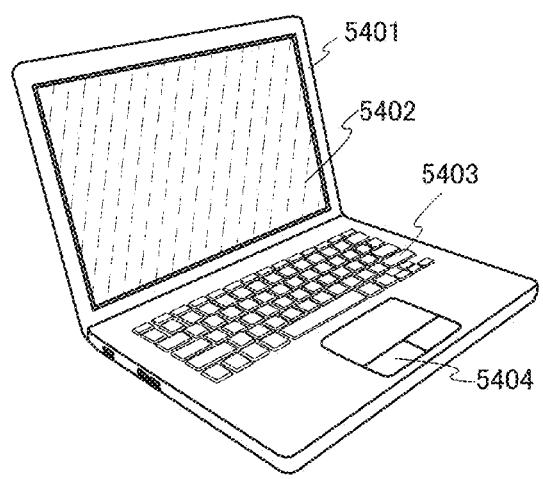

FIG. 17C illustrates a laptop, which includes a housing 5401, a display portion 5402, a keyboard 5403, a pointing device 5404, and the like. The semiconductor device of one embodiment of the present invention can be used for a variety of integrated circuits included in notebook personal computers.

Figure 17D:
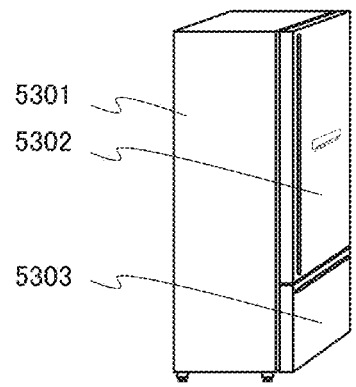

FIG. 17D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 17E:
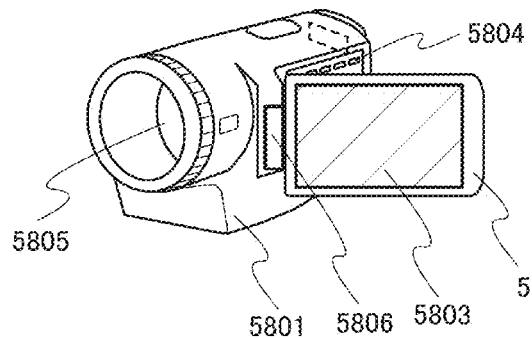

FIG. 17E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 17F:
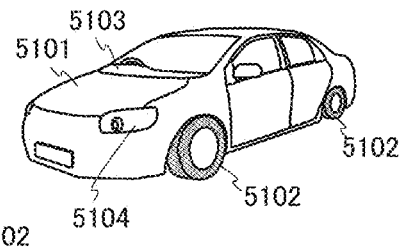

FIG. 17F illustrates a passenger car including a car body 5101, wheels 5102, a dashboard 5103, lights 5104, and the like. The semiconductor device of one embodiment of the present invention can be used for a variety of integrated circuits included in automobiles.

Example 1

In Example 1, results of current measurement using one embodiment of the present invention are described. Note that the measurement system shown in FIG. 1 was used in this example. The transistor described in the above embodiment with reference to FIGS. 7A to 7C, which had a channel length of 0.8 µm and a channel width of 10 cm and included a highly purified oxide semiconductor, was employed as a transistor under test, and its off-state current was measured.

Figure 18A:
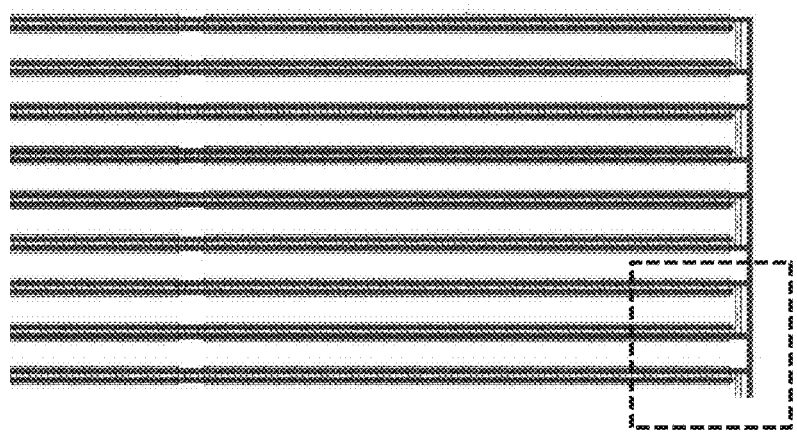
FIGS. 18A and 18B show a structure of a line electrically connecting terminals.
Figure 18B:
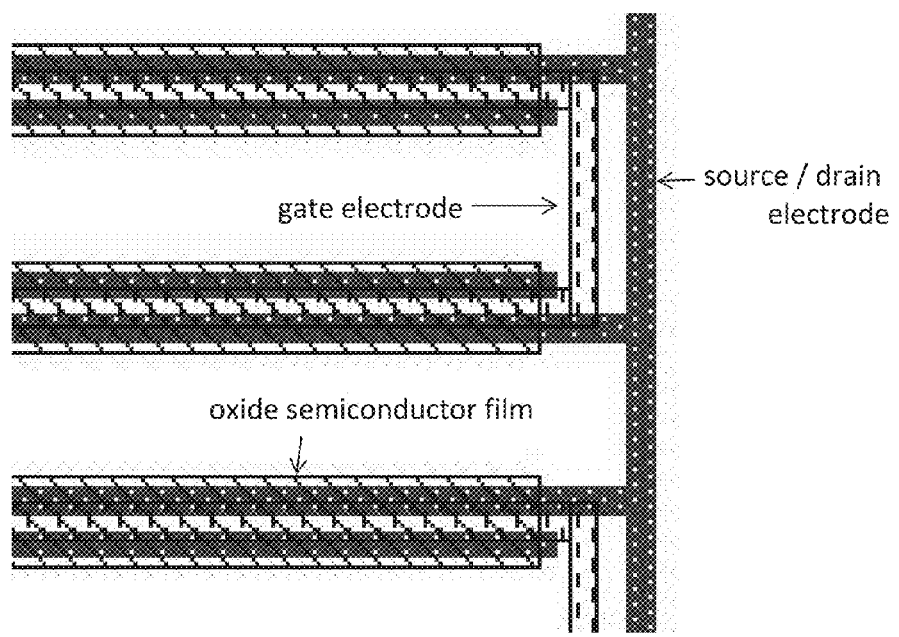
Figure 19A:
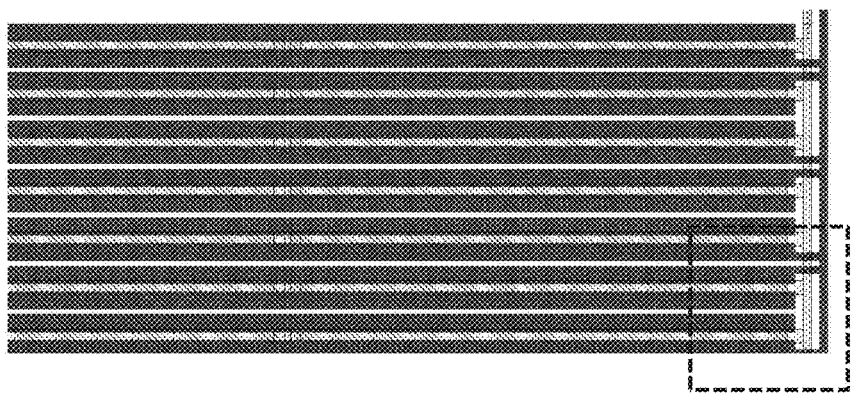
FIGS. 19A and 19B show a conventional structure of a line.
Figure 19B:
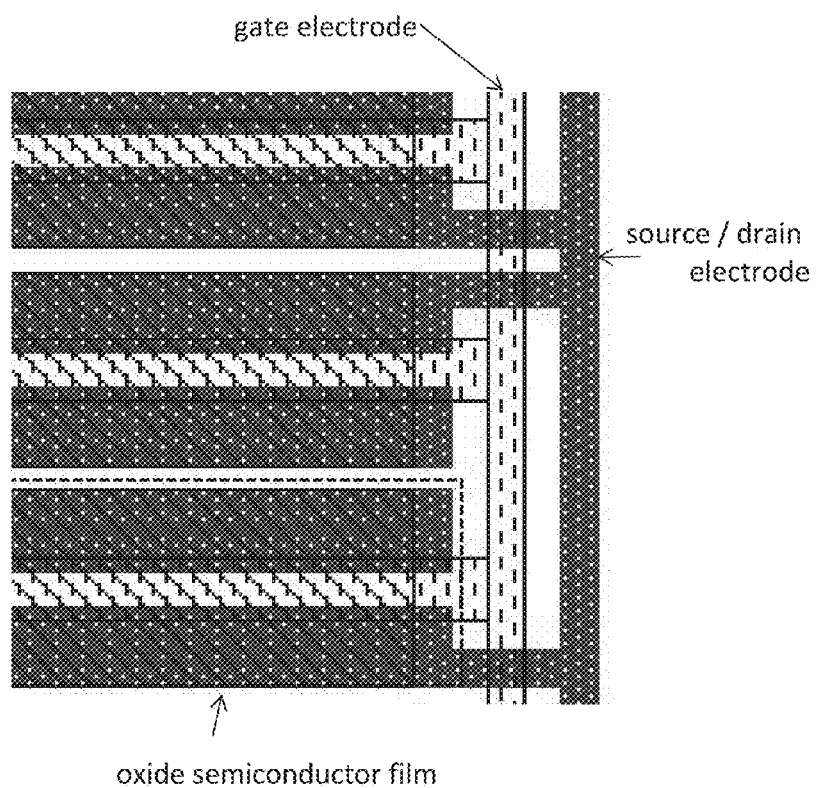

Note that because parasitic capacitance is generated in lines electrically connecting terminals, the line width is decreased to reduce the parasitic capacitance. FIGS. 18A and 18B illustrate a measurement system in which the line width is reduced to 0.35 µm in order to reduce the parasitic capacitance. FIGS. 19A and 19B illustrate a measurement system with a line width of 0.8 µm. Note that FIGS. 18A and 19A are overall views and FIGS. 18B and 19B are enlarged views of portions surrounded by dashed line in FIGS. 18A and 19A. The total capacitance of the node FN in FIGS. 18A and 18B is $5.24 \times 10^{-10}$ F. The drain-gate capacitance is $5.06 \times 10^{-10}$ F (96.5% of the total capacitance). The drain-source capacitance is $1.72 \times 10^{-12}$ F (0.3% of the total). The drain-substrate capacitance is $1.59 \times 10^{-11}$ F (3.0% of the total). Other is $6.21 \times 10^{-13}$ F (0.1% of the total). The total capacitance of the node FN in FIGS. 19A and 19B is $1.02 \times 10^{-10}$ F The drain-gate capacitance is $8.44 \times 10^{-11}$ F (82.9% of the total capacitance). The drain-source capacitance is $3.21 \times 10^{-12}$ F (3.2% of the total). The drain-substrate capacitance is $1.36 \times 10^{-11}$ F (13.4% of the total). Other is $6.21 \times 10^{-13}$ F (0.6% of the total).

The relationship between the potentials was decided according to the timing chart of FIG. 5. Data was retained at 125° C. for 10 hours. In the measurement period, the potential $V_{OUT}$ was measured at regular time intervals to estimate the potential of the node FN; thus, an off-state current value is obtained.

Figure 20:
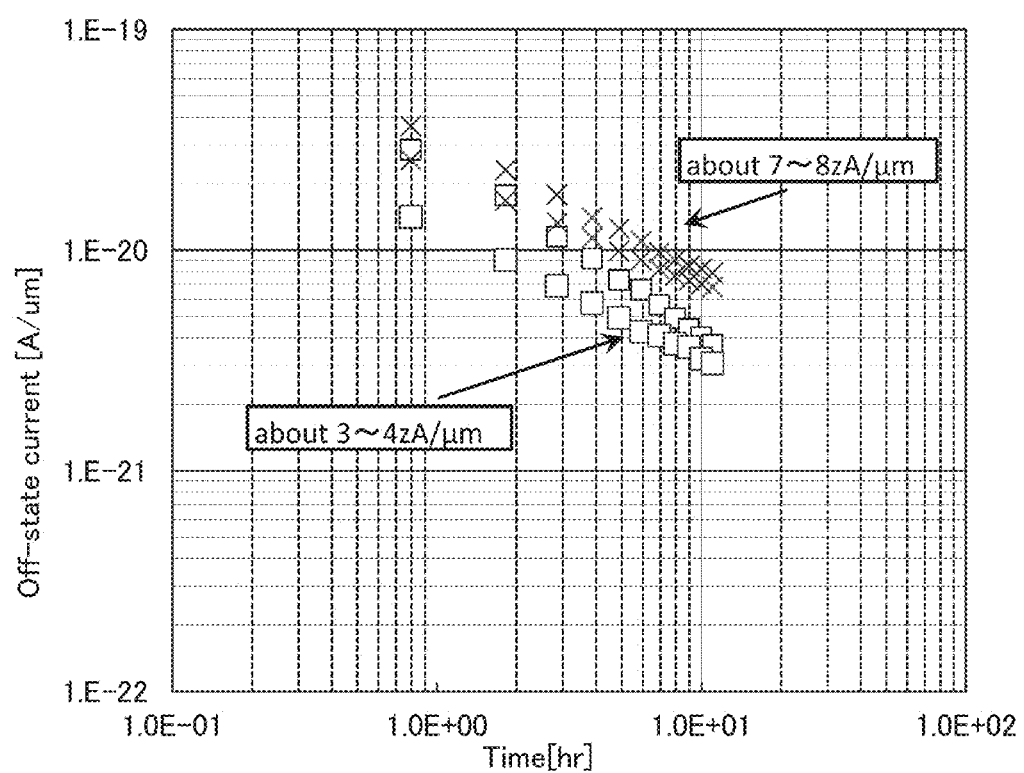
FIG. 20 shows relationship between off-state current and measurement time.

FIG. 20 shows the relationships between lapse time Time [hr] and off-state current [A/µm] in the current measurement. Note that in FIG. 20, square marks are results of the measurement system shown in FIGS. 18A and 18B and cross marks are those of the measurement system shown in FIGS. 19A and 19B. According to FIG. 20, the off-state current in the measurement system with the thinner line is smaller.

Next, another measurement system in which the line width was reduced and the structure described in the above embodiment with reference to FIGS. 7A to 7C, which had a channel length of 0.8 µm and a channel width of 1 m and included a highly purified oxide semiconductor, was employed was evaluated in a manner similar to the above.

Figure 21:
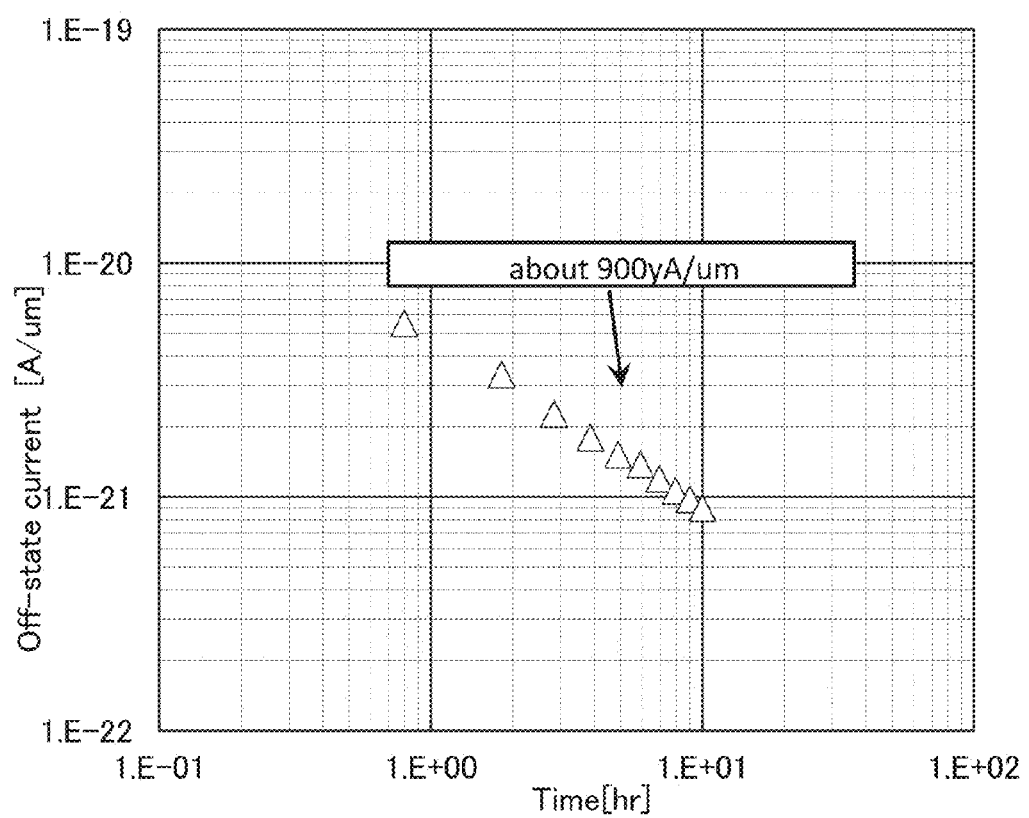
FIG. 21 shows relationship between off-state current and measurement time.

FIG. 21 shows the relationships between lapse time Time [hr] and off-state current [A/µm] in the current measurement. According to FIG. 21, the off-state current is approximately 900 yA/µm when the channel width is 1 m.

Example 2

In Example 2, results of current measurement using one embodiment of the present invention are described. Note that the measurement system shown in FIG. 1 was used in this example. The transistors described in the above embodiment with reference to FIGS. 7A to 7C to FIGS. 9A to 9C, each of which has a channel length of 0.8 µm and a channel width of 10 cm and includes a highly purified oxide semiconductor, were used in this example. Their off-state current were measured.

One transistor in this example, which has the structure shown in FIGS. 7A to 7C, has a smaller line width of 0.35 µm to reduce parasitic capacitance. The others in this example, which have the structures shown in FIGS. 8A to 8C and FIGS. 9A to 9C, have a line width of 0.8 µm.

Figure 22:
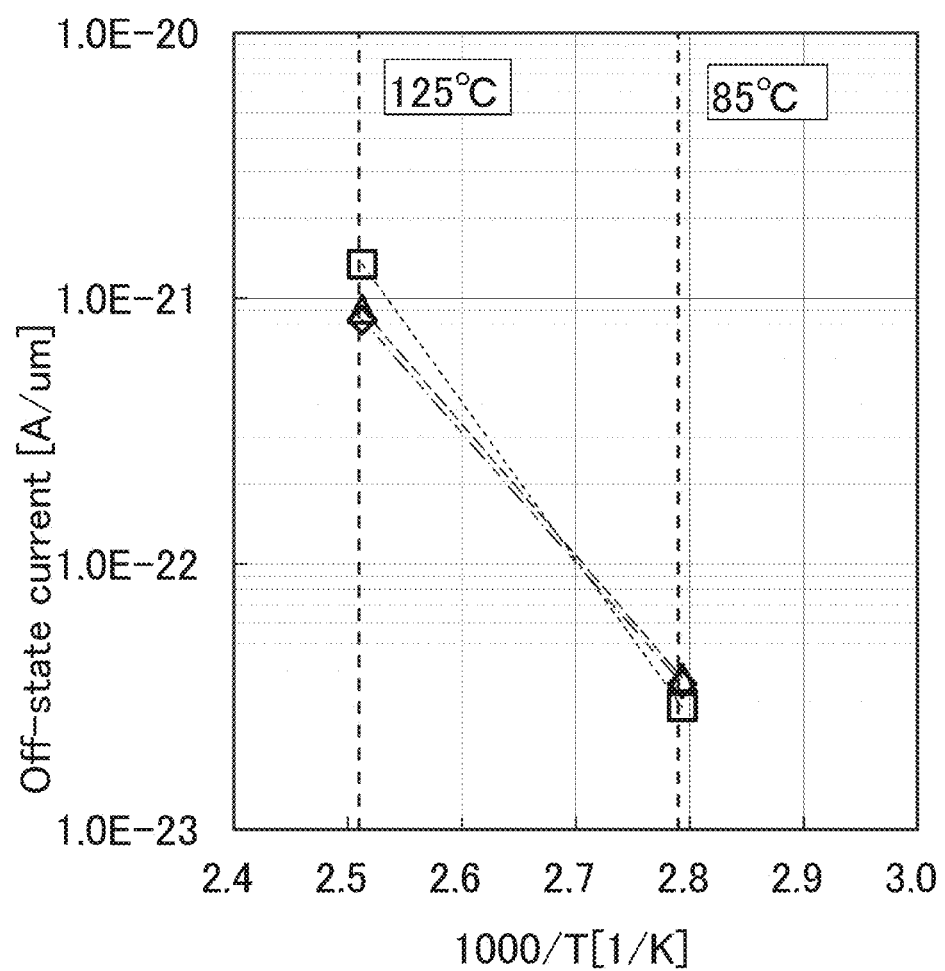
FIG. 22 shows relationship between off-state current and temperature.

The relationship between the potentials was decided according to the timing chart of FIG. 5. Data was retained at 125° C. for 10 hours. Data was retained at 85° C. for 24 hours. In the measurement period, the potential $V_{OUT}$ was measured to estimate the potential of the node FN; thus, an off-state current value is obtained. FIG. 22 shows the relationships between off-state current and the inverses of substrate temperatures (absolute temperatures) at the measurement. For easy understanding, the horizontal axis represents a value (1000/T) [1/K] obtained by multiplying the inverse of substrate temperature at the measurement by 1000. Note that in FIG. 22, square marks represent results of the measurement system having a smaller line width to reduce parasitic capacitance and employing the transistor shown in FIGS. 7A to 7C, triangle marks represent results of the measurement system having a smaller line width to reduce parasitic capacitance and employing the transistor shown in FIGS. 8A to 8C, and rectangular marks represent results of the measurement system having a smaller line width to reduce parasitic capacitance and employing the transistor shown in FIGS. 9A to 9C.

According to FIG. 22, under in the data retention at 85° C. for 24 hours, the off-state current was approximately $3 \times 10^{-23}$ A/µm (30 yA/µm). Under in the data retention at 125° C. for 10 hours, the off-state current was approximately $1 \times 10^{-21}$ A/µm (1 zA/µm).

Figure 23:
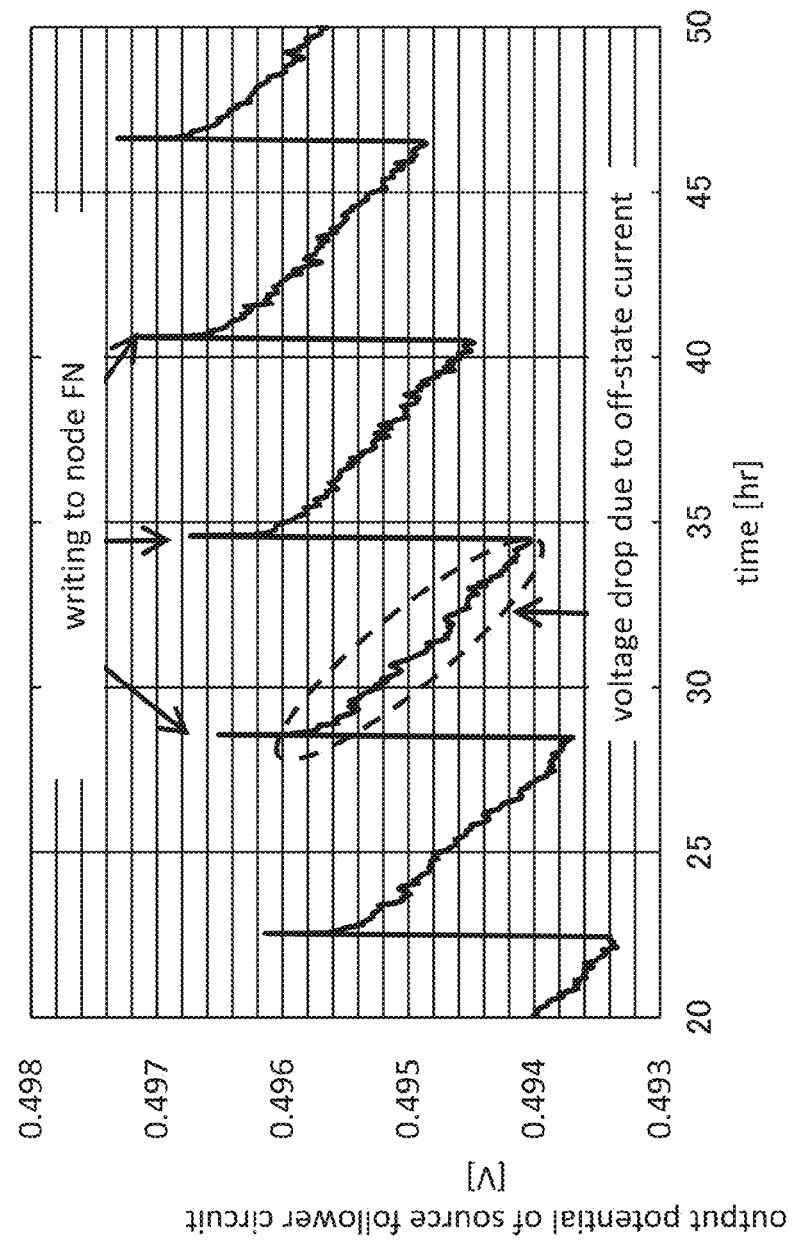
FIG. 23 shows relationship between output potential of a source follower and measurement time.

FIG. 23 is a graph plotting output potentials as a function of time of a read circuit (source follower circuit in this example) including the transistors 102 and 103 connected to the node FN.

According to FIG. 23, there is a small voltage drop due to off-state current after writing and before the next writing to the node FN: variation was within only 0.001 V to 0.002 V.

Example 3

In Example 3, results of current measurement using one embodiment of the present invention are described. Note that the measurement system shown in FIG. 1 was used in this example. The transistor described in the above embodiment with reference to FIGS. 7A to 7C, which had a channel length of 0.8 µm and a channel width of 10 cm and included a highly purified oxide semiconductor, was employed, and its off-state current was measured.

Two types of samples were prepared. For a sample 1, the oxide semiconductor film 92c of the transistor shown in FIGS. 7A to 7C was formed using a target having an atomic ratio of In:Ga:Zn=1:3:2. A line width of the sample 1 is 0.8

µm. For a sample 2, the oxide semiconductor film 92c of the transistor shown in FIGS. 7A to 7C was formed using a gallium oxide film. The line width of the sample 2 was reduced to 0.35 µm to reduce parasitic capacitance.

The relationship between the potentials was decided according to the timing chart of FIG. 5. Data was retained at 150° C. for 10 hours. Data was retained at 125° C. for 10 hours. Data was retained at 85° C. for 24 hours. For only the sample 1, data was retained at 60° C. for 60 hours. In the measurement period, the potential $V_{OUT}$ was measured to estimate the potential of the node FN; thus, an off-state current value is obtained.

Figure 24:
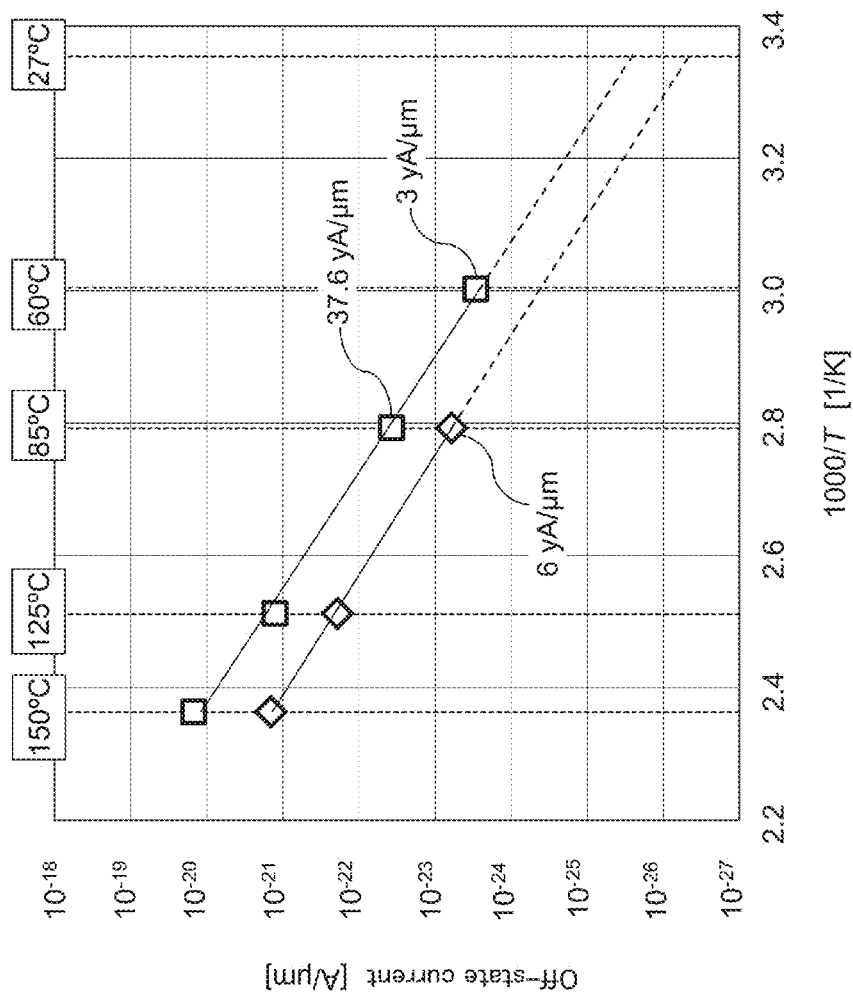
FIG. 24 shows relationship between off-state current and temperature.

FIG. 24 shows the relationships between off-state current and the inverses of substrate temperatures (absolute temperatures) at the measurement. For easy understanding, the horizontal axis represents a value (1000/T) [1/K] obtained by multiplying the inverse of substrate temperature at the measurement by 1000. Note that square marks and rectangular marks represent results of the sample 1 and the sample 2, respectively.

According to FIG. 24, in the data retention at 85° C. for 24 hours, the off-state current of the samples 1 and 2 were 37.6 yA/µm and 6 yA/µm, respectively. Furthermore, the off-state current of the sample 1 was 3 yA/µm in the data retention at 60° C. for 60 hours.

Example 4

In Example 4, the results of current measurement using one embodiment of the present invention are described. Note that the measurement system shown in FIG. 1 was used in this example. The transistor described in the above embodiment with reference to FIGS. 7A to 7C, which had a channel length of 0.8 µm and a channel width of 10 cm and included a highly purified oxide semiconductor, was employed, and its off-state current was measured.

The structure of the transistor in Example 4 is similar to that of the sample 2 in Example 3. Ten samples were measured while keeping the measurement system at 23° C.

The relationship between the potentials was decided according to the timing chart of FIG. 5. Data was retained at 150° C. for 10 hours. Data was retained at 125° C. for 10 hours. Data was retained at 85° C. for 24 hours. In the measurement period, the potential $V_{OUT}$ was measured to estimate the potential of the node FN; thus, an off-state current value is obtained.

Figure 25:
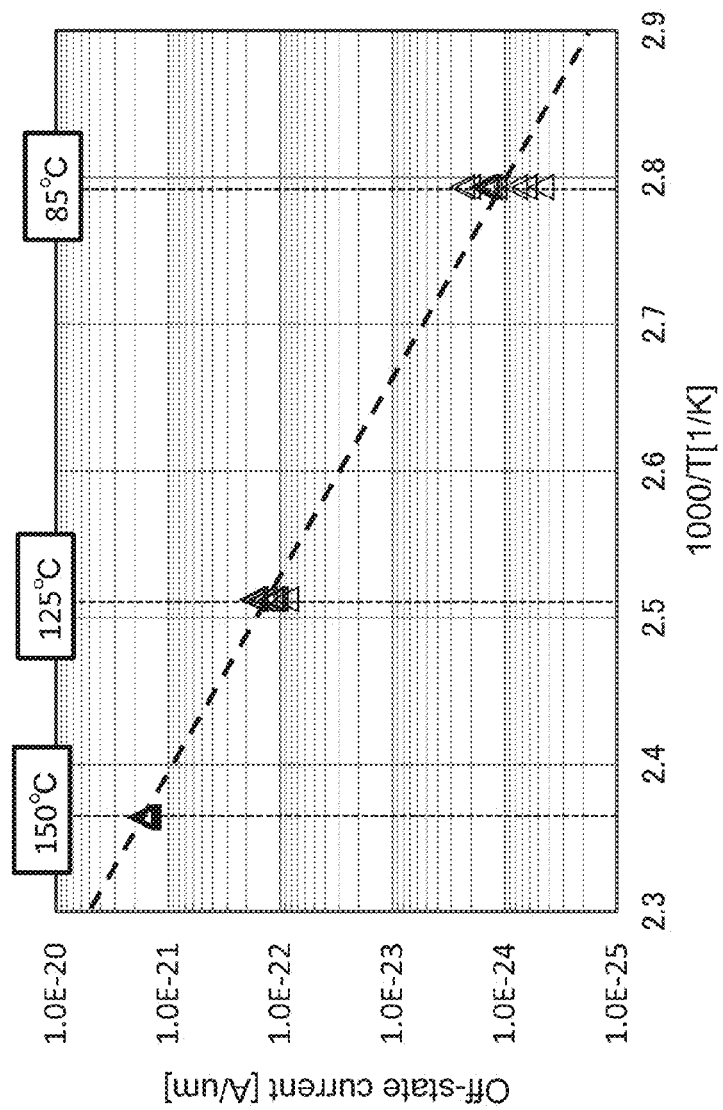
FIG. 25 shows relationship between off-state current and temperature.

FIG. 25 shows the relationships between off-state current and the inverses of substrate temperatures (absolute temperatures) at the measurement. For easy understanding, the horizontal axis represents a value (1000/T) [1/K] obtained by multiplying the inverse of substrate temperature at the measurement by 1000.

According to FIG. 25, off-state current of 1 yA/µm or smaller was obtained in the data retention at 85° C. for 24 hours.

This application is based on Japanese Patent Application serial no. 2014-031785 filed with Japan Patent Office on Feb. 21, 2014, Japanese Patent Application serial no. 2014-050310 filed with Japan Patent Office on Mar. 13, 2014, Japanese Patent Application serial no. 2014-065766 filed with Japan Patent Office on Mar. 27, 2014, the entire contents of which are hereby incorporated by reference.

What is claimed is:

1. A method for measuring an off-state current of a transistor, the method comprising the steps of:
    applying a first potential to one of a source and a drain of the transistor and applying a second potential to a gate of the transistor so that the transistor exists in an off-state;
    applying a third potential to one of a source and a drain of a first transistor;
    turning the first transistor on so that charge is accumulated in a node which is electrically connected to the other of the source and the drain of the transistor and the other of the source and the drain of the first transistor;
    measuring a fourth potential of an output terminal of a read circuit electrically connected to the node and then turning the first transistor off;
    measuring a fifth potential of the output terminal while the first transistor is in an off-state;
    estimating change in the charge held in the node from a difference between the fourth potential and the fifth potential; and
    calculating a value of current flowing between the one of the source and the drain of the transistor and the other of the source and the drain of the first transistor from the change in the charge held in the node,
    wherein a width of lines electrically connecting terminals of the transistors is greater than or equal to 20 nm and smaller than or equal to 0.5 µm, and
    wherein a capacitance between the drain of the transistor and a substrate is about 3.0% of a total capacitance of the node.

2. The method according to claim 1, wherein a channel width of the transistor is larger than a channel width of the first transistor.

3. The method according to claim 1,
    wherein the read circuit comprises a second transistor and a third transistor,
    wherein a gate of the second transistor is electrically connected to the node, and
    wherein one of a source and a drain of the second transistor and one of a source and a drain of the third transistor are electrically connected to the output terminal.

4. The method according to claim 3, further comprising the step of:
    applying a common potential to the other of the source and the drain of the second transistor, a gate of the third transistor, and the other of the source and the drain of the third transistor in a period.

5. The method according to claim 1,
    wherein the measurement of the off-state current of the transistor is performed in a constant-temperature environment.

6. The method according to claim 1,
    wherein a sample temperature is kept constant using an inert oven.

7. A circuit configured to measure an off-state current of a transistor, the circuit comprising:
    a first transistor over a substrate; and
    a read circuit,
    wherein one of a source and a drain of the first transistor, one of a source and a drain of the transistor and an input of the read circuit are electrically connected to a node, and
    wherein a width of lines is greater than or equal to 20 nm and smaller than or equal to 0.5 µm,
    wherein the circuit is capable of measuring the off-state current less than or equal to 1 yA per 1 µm of a channel width of the transistor, and
    wherein a capacitance between the drain of the transistor and a substrate is about 3.0% of a total capacitance of the node.

8. The circuit according to claim 7, wherein the channel width of the transistor is larger than a channel width of the first transistor.

9. The circuit according to claim 7,
wherein the read circuit comprises a second transistor and a third transistor,
wherein a gate of the second transistor is electrically connected to the node, and
wherein one of a source and a drain of the second transistor and one of a source and a drain of the third transistor are electrically connected to an output terminal of the read circuit.

* * * * *